US011380263B2

(12) United States Patent
Yoon et al.

(10) Patent No.: US 11,380,263 B2
(45) Date of Patent: Jul. 5, 2022

(54) ORGANIC LIGHT EMITTING DIODE DISPLAY DEVICE

(71) Applicant: Samsung Display Co., LTD., Yongin-si (KR)

(72) Inventors: Ju-Won Yoon, Suwon-si (KR); Gun Hee Kim, Seoul (KR); Sang Ho Park, Hwaseong-si (KR); Seung Chan Lee, Hwaseong-si (KR); Joo Hee Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/254,216

(22) PCT Filed: May 22, 2019

(86) PCT No.: PCT/KR2019/006139
§ 371 (c)(1),
(2) Date: Dec. 18, 2020

(87) PCT Pub. No.: WO2019/245173
PCT Pub. Date: Dec. 26, 2019

(65) Prior Publication Data
US 2021/0272521 A1    Sep. 2, 2021

(30) Foreign Application Priority Data

Jun. 22, 2018    (KR) .................. 10-2018-0071966

(51) Int. Cl.
*G09G 3/3258* (2016.01)
*G09G 3/3291* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3233; G09G 3/3266; G09G 3/3291; H01L 27/3258;
(Continued)

(56) References Cited

U.S. PATENT DOCUMENTS 11,037,486 B2 * 6/2021 Kim ..................... G09G 3/3233
2004/0174349 A1   9/2004 Libsch et al.
(Continued)

FOREIGN PATENT DOCUMENTS

CN          107358915 A    11/2017
KR    10-2015-0101028 A     9/2015
(Continued)

OTHER PUBLICATIONS

International Search Report corresponding to PCT/KR2019/006139, dated Sep. 17, 2019, 4 pages.

*Primary Examiner* — Sardis F Azongha
(74) *Attorney, Agent, or Firm* — Lewis Roca Rothgerber Christie LLP

(57) ABSTRACT

An organic light emitting diode display includes: a substrate; an overlapping layer on the substrate; a pixel on the substrate and the overlapping layer; and a scan line, a data line, a driving voltage line, and an initialization voltage line that are connected to the pixel. The pixel includes: an organic light emitting diode; a second transistor connected to the scan line and the data line; a driving transistor including a gate electrode, an input terminal, and an output terminal, and to apply a current to the organic light emitting diode from the output terminal; and a voltage application transistor to apply a voltage to the overlapping layer. An output of the second transistor is connected to the input terminal of the driving transistor, and the overlapping layer is between the driving transistor and the substrate while overlapping with the driving transistor on a plane.

20 Claims, 12 Drawing Sheets

(51) Int. Cl.
*G09G 3/3266* (2016.01)
*H01L 27/32* (2006.01)
*H01L 51/52* (2006.01)
*G09G 3/3233* (2016.01)

(52) U.S. Cl.
CPC ....... *G09G 3/3291* (2013.01); *H01L 27/3258* (2013.01); *H01L 27/3265* (2013.01); *H01L 27/3276* (2013.01); *H01L 51/5253* (2013.01); *G09G 2300/0426* (2013.01); *G09G 2300/0819* (2013.01); *G09G 2300/0842* (2013.01); *G09G 2300/0861* (2013.01); *G09G 2320/0233* (2013.01)

(58) Field of Classification Search
CPC ............. H01L 27/3265; H01L 27/3276; H01L 51/5253
See application file for complete search history.

(56) References Cited

U.S. PATENT DOCUMENTS

| | | |
|---|---|---|
| 2013/0069068 A1 | 3/2013 | Miyake |
| 2016/0204172 A1* | 7/2016 | Park ................... H01L 27/3248 257/40 |
| 2017/0337875 A1 | 11/2017 | Jeon et al. |
| 2018/0166585 A1 | 6/2018 | Takechi |
| 2018/0190194 A1 | 7/2018 | Zhu et al. |
| 2018/0286308 A1 | 10/2018 | Yoon et al. |

FOREIGN PATENT DOCUMENTS

| | | | |
|---|---|---|---|
| KR | 10-2016-0018892 A | 2/2016 | |
| KR | 10-2017-0006321 A | 1/2017 | |
| KR | 10-1740144 B1 | 5/2017 | |
| KR | 10-2017-0064128 A | 6/2017 | |
| KR | 20200048652 A * | 5/2020 | ........... G09G 3/3233 |

* cited by examiner

ORGANIC LIGHT EMITTING DIODE DISPLAY DEVICE

CROSS-REFERENCE TO RELATED APPLICATION

This application is a U.S. National Phase Patent Application of International Application No. PCT/KR2019/006139, filed on May 22, 2019, which claims priority to Korean Patent Application No. 10-2018-0071966, filed on Jun. 22, 2018, the entire content of all of which is incorporated by reference herein.

BACKGROUND

1. Field

Aspects of example embodiments of the present disclosure relate to an organic light emitting diode (OLED) display.

2. Description of the Related Art

A display device is a device that displays an image, and recently, an organic light emitting diode display has been attracting attention.

Unlike a liquid crystal display device, the organic light emitting diode display has a self-luminous characteristic, and because it does not use or need a separate light source, unlike a liquid crystal display, it may have a relatively small thickness and weight. In addition, because the organic light emitting diode display exhibits high-quality characteristics such as low power consumption, high luminance, high response speed, and/or the like, it is receiving much attention as a display device.

In general, the organic light emitting diode display includes a substrate, a plurality of thin film transistors disposed on the substrate, a plurality of insulation layers that are disposed between wires that form the thin film transistors, and an organic light emitting diode connected to the thin film transistors.

The above information disclosed in this Background section is for enhancement of understanding of the background of the present disclosure, and therefore, it may contain information that does not constitute prior art.

SUMMARY

One or more example embodiments of the present disclosure are directed to an organic light emitting diode display having uniform or substantially uniform display quality by mitigating a different characteristic of a driving transistor formed in the organic light emitting diode display even if the driving transistor has different characteristics according to its position. One or more example embodiments of the present disclosure are directed to improving a charging rate of a data voltage in a driving transistor formed in an organic light emitting diode display.

According to one or more example embodiments of the present disclosure, an organic light emitting diode display includes: a substrate; an overlapping layer on the substrate; a pixel on the substrate and the overlapping layer; and a scan line, a data line, a driving voltage line, and an initialization voltage line that are connected to the pixel. The pixel includes: an organic light emitting diode; a second transistor connected to the scan line and the data line; a driving transistor including a gate electrode, an input terminal, and an output terminal, and configured to apply a current to the organic light emitting diode from the output terminal; and a voltage application transistor configured to apply a voltage to the overlapping layer. An output of the second transistor is connected to the input terminal of the driving transistor, and the overlapping layer is between the driving transistor and the substrate while overlapping with the driving transistor on a plane.

In an example embodiment, the voltage application transistor may include a first voltage application transistor, and the first voltage application transistor may be configured to apply a driving voltage to the overlapping layer.

In an example embodiment, the voltage application transistor may further include a second voltage application transistor, and the second voltage application transistor may be configured to apply an initialization voltage to the overlapping layer.

In an example embodiment, the first voltage application transistor may be configured to be turned on during a light emission period to apply the driving voltage to the overlapping layer, and the second voltage application transistor may be configured to be turned on during a writing period to apply the initialization voltage to the overlapping layer.

In an example embodiment, the voltage application transistor may be configured to apply an initialization voltage to the overlapping layer.

In an example embodiment, a first voltage may be applied to the overlapping layer during a light emission period, and a second voltage that is different from the first voltage may be applied to the overlapping layer during a writing period.

In an example embodiment, the first voltage may have a higher voltage value compared to that of the second voltage.

In an example embodiment, the first voltage may be higher than a threshold voltage of the driving transistor, and the second voltage may be lower than the threshold voltage of the driving transistor.

In an example embodiment, the first voltage may be a driving voltage, and the second voltage may be an initialization voltage.

In an example embodiment, the pixel may further include a third transistor, a first electrode of the third transistor may be connected with the output terminal of the driving transistor, and a second electrode of the third transistor may be connected with the gate electrode of the driving transistor.

According to one or more example embodiments of the present disclosure, an organic light emitting diode display includes: a substrate; an overlapping layer on the substrate; a buffer layer on the overlapping layer; a semiconductor layer on the buffer layer; a first gate insulating layer covering the semiconductor layer; a first gate conductor on the first gate insulating layer; a second gate insulating layer covering the first gate conductor and the first gate insulating layer; a second gate conductor on the second gate insulating layer; an interlayer insulating layer covering the second gate conductor and the second gate insulating layer; a data conductor on the interlayer insulating layer; and a passivation layer covering the data conductor and the interlayer insulating layer. A driving transistor includes a channel in the semiconductor layer, and a gate electrode in the first gate conductor. The overlapping layer overlaps with the channel of the driving transistor on a plane. An opening that exposes the overlapping layer penetrates at least a part of the buffer layer, the first gate insulating layer, the second gate insulating layer, and the interlayer insulating layer. The overlapping layer is configured to be applied with a voltage through the opening, and the voltage is an initialization voltage that is applied during a writing period, and a driving voltage that is applied during a light emission period.

In an example embodiment, the semiconductor layer may be connected with the overlapping layer through the opening.

In an example embodiment, an additional connection member in the second gate conductor may be a layer connected with the overlapping layer through the opening.

In an example embodiment, the additional connection member may be connected with the semiconductor layer, and the overlapping layer may be configured to receive the voltage that is applied to the semiconductor layer through the additional connection member.

In an example embodiment, the semiconductor layer may include a channel of a second transistor, the second transistor may be connected with a scan line and a data line, and an input terminal of the driving transistor may be configured to receive an output of the second transistor.

In an example embodiment, the semiconductor layer may further include a channel of a voltage application transistor, and the overlapping layer may be configured to be applied with the voltage from the voltage application transistor.

In an example embodiment, the voltage application transistor may include a first voltage application transistor configured to apply the driving voltage to the overlapping layer.

In an example embodiment, the voltage application transistor may further include a second voltage application transistor configured to apply the initialization voltage to the overlapping layer.

In an example embodiment, the voltage application transistor may be configured to apply the initialization voltage to the overlapping layer.

In an example embodiment, the organic light emitting diode display may further include a storage capacitor overlapping with the gate electrode of the driving transistor, and the overlapping layer may also overlap with the storage capacitor.

According to one or more example embodiments of the present disclosure, a suitable voltage (e.g., a specific or predetermined voltage) may be applied to an overlapping layer overlapping with the driving transistor, thereby increasing the data range of the driving transistor. As a result, the driving transistor may be less affected by the gate-source voltage Vgs, and thus, even though there is a characteristic deviation, it may be reduced to display an image. Accordingly, the display quality may be less affected by the characteristic deviation of the driving transistor.

According to one or more example embodiments of the present disclosure, another suitable voltage (e.g., another specific or predetermined voltage) may be applied to the overlapping layer overlapping with the driving transistor to reduce the data range of the driving transistor. Accordingly, the data voltage may be charged (e.g., may be easily charged) through the driving transistor.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
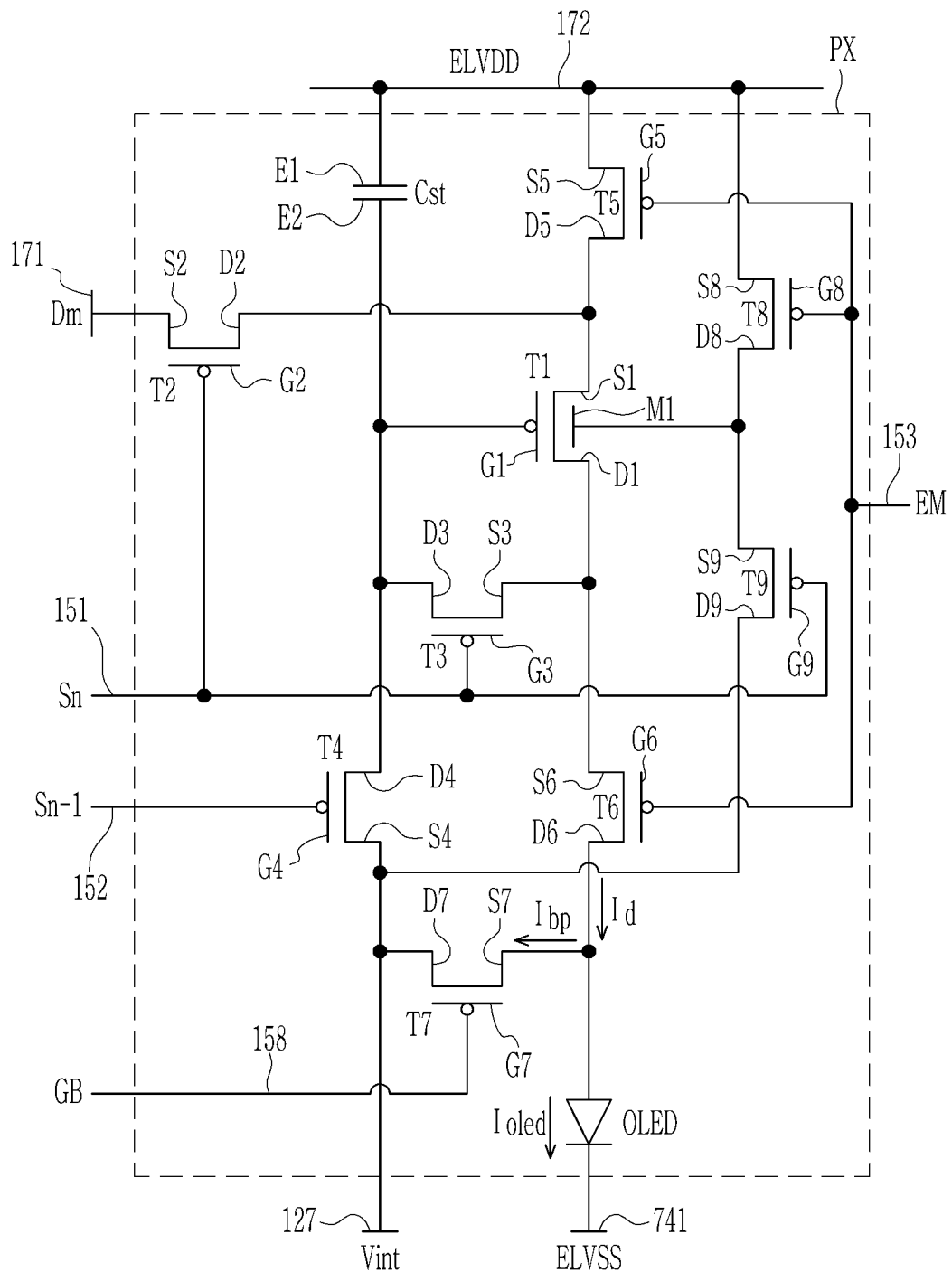
FIG. 1 is an equivalent circuit diagram of a pixel of an organic light emitting diode display according to an exemplary embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. Further, throughout the specification, the phrase "on a plane" refers to a view of a target portion from the top, and the phrase "on a cross-section" refers to a view of a cross-section formed by vertically cutting a target portion from the side.

It will be understood that when an element or layer is referred to as being "on," "connected to," or "coupled to" another element or layer, it can be directly on, connected to, or coupled to the other element or layer, or one or more intervening elements or layers may be present. Further, throughout the specification, the term "on" a target element will be understood to be positioned above or below the target element, and will not necessarily be understood to be positioned "at an upper side" based on a direction opposite to the gravity direction. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

An organic light emitting diode display according to an exemplary embodiment will now be described with reference to FIG. 1 and FIG. 2.

Figure 2:
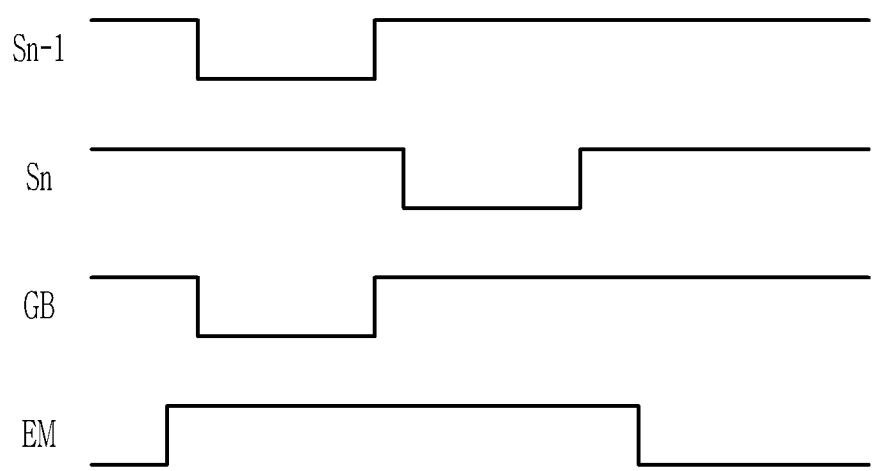
FIG. 2 is a timing diagram of a signal applied to the pixel of the organic light emitting diode display according to an exemplary embodiment.

FIG. 1 is an equivalent circuit diagram of a pixel of an organic light emitting diode display according to an exemplary embodiment, and FIG. 2 is a timing diagram of a signal applied to the pixel of the organic light emitting diode display according to an exemplary embodiment.

Referring to FIG. 1, an organic light emitting diode display includes a plurality of transistors T1, T2, T3, T4, T5, T6, T7, T8, and T9 that are connected to a plurality of signal lines 127, 151, 152, 153, 158, 171, 172, and 741, a storage capacitor Cst, and an organic light emitting diode OLED.

Referring to FIG. 1, a driving transistor T1 that supplies a current to the organic light emitting diode OLED includes an overlapping layer M1 that overlaps with the driving transistor T1, and the overlapping layer M1 is disposed at an opposite side of a gate electrode G1 of the driving transistor T1 with reference to a semiconductor layer where a channel of the driving transistor T1 is formed. The overlapping layer M1 may be referred to as a second gate electrode, because the overlapping layer M1 may serve as a second gate electrode of the driving transistor T1.

The overlapping layer M1 is connected to an eighth transistor T8 and a ninth transistor T9. The overlapping layer M1 receives a driving voltage ELVDD through the eighth transistor T8, and an initialization voltage Vint through the ninth transistor T9. A section (e.g., a time period) during which the driving voltage ELVDD is applied to the overlapping layer M1 and a section (e.g., a time period) during which the initialization voltage Vint is applied to the overlapping layer M1 may not overlap with each other. Hereinafter, one or both of the eighth transistor T8 and the ninth transistor T9 may be referred to as a voltage application transistor (e.g., a first voltage application transistor and a second voltage application transistor, respectively). While the driving voltage ELVDD and the initialization voltage Vint are used in the present exemplary embodiment, the driving voltage ELVDD and the initialization voltage Vint may be different voltages where one voltage may be higher than the other voltage, and thus, a voltage higher than a threshold voltage of the transistor T1 and a voltage lower than the threshold voltage of the transistor T1 may be used.

As described in more detail with reference to FIG. 3, characteristics of the driving transistor T1 may be changed depending on a voltage applied to the overlapping layer M1.

The pixel PX shown in FIG. 1 includes a total of nine transistors.

The nine transistors include the driving transistor T1 that provides a current to the organic light emitting diode OLED, and a second transistor T2 that is connected to a scan line 151 and a data line 171 and provides a data voltage to the pixel PX. Further, the nine transistors include a third transistor T3, a fourth transistor T4, a fifth transistor T5, a sixth transistor T6, a seventh transistor T7, the eighth transistor T8, and the ninth transistor T9, which are transistors (which may be hereinafter referred to as compensation transistors) for operating the organic light emitting diode OLED.

The plurality of signal lines 127, 151, 152, 153, 158, 171, 172, and 741 may include the scan line 151, a previous scan line 152, a light emission control line 153, a bypass control line 158, the data line 171, a driving voltage line 172, an initialization voltage line 127, and a common voltage line

741. The bypass control line 158 may be a part of the previous scan line 152, or may be electrically connected to the previous scan line 152.

The scan line 151 is connected to a gate driver, and transmits a scan signal Sn to the second transistor T2, the third transistor T3, and the ninth transistor T9. The previous scan line 152 is connected to the gate driver, and transmits a previous scan signal Sn−1 applied to a pixel PX, which is located in a previous stage, to the fourth transistor T4. The light emission control line 153 is connected to a light emission control portion, and transmits a light emission control signal EM that controls a light emission time of the organic light emitting diode OLED to the fifth transistor T5, the sixth transistor T6, and the eighth transistor T8. The bypass control line 158 transmits a bypass signal GB to the seventh transistor T7, and may transmit the same signal as that of the previous scan signal Sn−1 depending on a circuit structure of exemplary embodiments.

The data line 171 is a wire for transmitting a data voltage Dm generated from a data driver, and luminance of the light emitting diode OLED (also referred to as an organic light emitting element) is changed depending on the data voltage Dm. The driving voltage line 172 applies the driving voltage ELVDD, and the initialization voltage line 127 transmits the initialization voltage Vint that initializes the driving transistor T1. The common voltage line 741 applies a common voltage ELVSS. Voltages applied to the driving voltage line 172, the initialization voltage line 127, and the common voltage line 741 may be constant or substantially constant voltages, respectively.

Hereinafter, a plurality of transistors will be described in more detail.

The driving transistor T1 is a transistor that adjusts intensity of an output current according to the applied data voltage Dm, and an output driving current Id is applied to the organic light emitting diode OLED. Thus, brightness of the organic light emitting diode OLED is adjusted according to the data voltage Dm. A first electrode S1 (also referred to as an input terminal) of the driving transistor T1 is disposed to receive the driving voltage ELVDD, and thus, is connected with the driving voltage line 172 via the fifth transistor T5. In addition, the first electrode S1 of the driving transistor T1 is also connected with a second electrode D2 of the second transistor T2, and thus, receives the data voltage Dm. A second electrode D1 (also referred to as an output terminal) of the driving transistor T1 is disposed to output a current toward the organic light emitting diode OLED, and is connected with an anode of the organic light emitting diode OLED via the sixth transistor T6. The gate electrode G1 of the driving transistor T1 is connected with one electrode (e.g., a second storage electrode E2) of the storage capacitor Cst. Thus, a voltage of the gate electrode G1 is changed according to a voltage stored in the storage capacitor Cst, and accordingly, the driving current Id output from the driving transistor T1 is changed.

In addition, the driving transistor T1 further includes the overlapping layer M1 that overlaps with the driving transistor T1. The overlapping layer M1 may serve as another gate electrode of the driving transistor T1.

The second transistor T2 is a transistor that receives the data voltage Dm in the pixel PX. A gate electrode G2 of the second transistor T2 is connected with the scan line 151, and a first electrode S2 of the second transistor T2 is connected with the data line 171. The second electrode D2 of the second transistor T2 is connected with the first electrode S1 of the driving transistor T1. When the second transistor T2 is turned on according to the scan signal Sn transmitted through the scan line 151, the data voltage Dm transmitted through the data line 171 is transmitted to the first electrode S1 of the driving transistor T1.

The third transistor T3 is a transistor that enables a compensation voltage (e.g., Dm+Vth), which has been changed from the data voltage Dm while passing through the driving transistor T1, to be transmitted to the second storage electrode E2 of the storage capacitor Cst. A gate electrode G3 of the third transistor T3 is connected with the scan line 151. A first electrode S3 of the third transistor T3 is connected with the second electrode D1 of the driving transistor T1, and a second electrode D3 of the third transistor T3 is connected with the second storage electrode E2 of the storage capacitor Cst and the gate electrode G1 of the driving transistor T1. The third transistor T3 is turned on according to the scan signal Sn transmitted through the scan line 151, and thus, connects the gate electrode G1 and the second electrode D1 of the driving transistor T1 to each other, and connects the second electrode D1 of the driving transistor T1 and the second storage electrode E2 of the storage capacitor Cst to each other. In other words, when the third transistor T3 is turned on, the third transistor T3 may diode-connect the driving transistor T1.

The fourth transistor T4 serves to initialize the gate electrode G1 of the driving transistor T1 and the second storage electrode E2 of the storage capacitor Cst. A gate electrode G4 of the fourth transistor T4 is connected with the previous scan line 152, and a first electrode S4 of the fourth transistor T4 is connected with the initialization voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst according to the previous scan signal Sn−1 transmitted through the previous scan line 152. Accordingly, a gate voltage of the gate electrode G1 of the driving transistor T1 and the storage capacitor Cst are initialized. The initialization voltage Vint may be a voltage having a low voltage value that may turn on the driving transistor T1.

The fifth transistor T5 serves to transmit the driving voltage ELVDD to the driving transistor T1. A gate electrode G5 of the fifth transistor T5 is connected with the light emission control line 153, and a first electrode S5 of the fifth transistor T5 is connected with the driving voltage line 172. The fifth transistor T5 and the second electrode D5 of the fifth transistor T5 are connected with the first electrode S1 of the driving transistor T1.

The sixth transistor T6 serves to transmit the driving current Id output from the driving transistor T1 to the organic light emitting diode OLED. A gate electrode G6 of the sixth transistor T6 is connected with the light emission control line 153, and a first electrode S6 of the sixth transistor T6 is connected with the second electrode D1 of the driving transistor T1. A second electrode D6 of the sixth transistor T6 is connected with the anode of the organic light emitting diode OLED.

The fifth transistor T5 and the sixth transistor T6 are concurrently (e.g., simultaneously) turned on according to the light emission control signal EM transmitted through the light emission control line 153, and when the driving voltage ELVDD is applied to the first electrode S1 of the driving transistor T1 through the fifth transistor T5, the driving transistor T1 outputs the driving current Id according to a voltage (e.g., a voltage of the second storage electrode E2 of the storage capacitor Cst) of the gate electrode G1 of the driving transistor T1. The output driving current Id is transmitted to the organic light emitting diode OLED through the sixth transistor T6. As a current Ioled flows to the organic light emitting diode OLED, the organic light emitting diode OLED emits light.

The seventh transistor T7 serves to initialize the anode of the organic light emitting diode OLED. The gate electrode G7 of the seventh transistor T7 is connected with the bypass control line 158, a first electrode S7 of the seventh transistor T7 is connected with the anode of the organic light emitting diode OLED, and a second electrode D2 of the seventh transistor T7 is connected with the initialization voltage line 127. The bypass control line 158 may be connected to the previous scan line 152, and the bypass signal GB is applied at the same or substantially the same timing as that of the previous scan signal Sn−1. However, the present disclosure is not limited thereto, and in some embodiments, the bypass control line 158 may not be connected to the previous scan line 152, and may transmit a separate signal from the previous scan signal Sn−1. When the seventh transistor T7 is turned on according to the bypass signal GB, the initialization voltage Vint is applied to the anode of the organic light emitting diode OLED, and thus, the anode of the organic light emitting diode OLED is initialized.

The eighth transistor T8 serves to transmit the driving voltage ELVDD to the overlapping layer M1 that overlaps with the driving transistor T1. The gate electrode G8 of the eighth transistor T8 is connected with the light emission control line 153, a first electrode S8 of the eighth transistor T8 is connected with the driving voltage line 172, and a second electrode D8 of the eighth transistor T8 is connected with the overlapping layer M1.

The eighth transistor T8 is also concurrently (e.g., simultaneously) turned on with the fifth transistor T5 and the sixth transistor T6 according to the light emission control signal EM transmitted through the light emission control line 153, and transmits the driving voltage ELVDD to the overlapping layer M1.

The ninth transistor T9 serves to transmit the initialization voltage Vint to the overlapping layer M1. A gate electrode G9 of the ninth transistor T9 is connected with the scan line 151, a first electrode S9 of the ninth transistor T9 is connected with the overlapping layer M1, and a second electrode D9 of the ninth transistor T9 is connected with the initialization voltage line 127. The ninth transistor T9 is concurrently (e.g., simultaneously) turned on with the second transistor T2 and the third transistor T3 according to the scan signal Sn, and initializes a voltage of the overlapping layer M1.

The pixel PX includes the storage capacitor Cst. The storage capacitor Cst stores a data voltage applied thereto through the driving transistor T1.

A first storage electrode E1 of the storage capacitor Cst is connected with the driving voltage line 172, and the second storage electrode E2 of the storage capacitor Cst is connected with the gate electrode G1 of the driving transistor T1, the second electrode D3 of the third transistor T3, and the second electrode D4 of the fourth transistor T4. Thus, the second storage electrode E2 of the storage capacitor Cst determines a voltage (e.g., a gate-source voltage Vgs of the driving transistor T1) of the gate electrode G1 of the driving transistor T1, and receives the data voltage Dm through the second electrode D3 of the third transistor T3, or receives the initialization voltage Vint through the second electrode D4 of the fourth transistor T4.

The pixel PX includes the organic light emitting diode OLED. The anode of the organic light emitting diode OLED is connected with the second electrode D6 of the sixth transistor T6 and the first electrode S7 of the seventh transistor T7, and a cathode of the organic light emitting diode OLED is connected with the common voltage line 741 that transmits the common voltage ELVSS.

In the exemplary embodiment of FIG. 1, the pixel circuit includes nine transistors T1 to T9 and one capacitor Cst, but the present disclosure is not limited thereto. For example, in other embodiments, the number of transistors and/or the number of capacitors, and the connections therebetween, may be variously modified as would be understood by those having ordinary skill in the art.

The organic light emitting diode display includes a display area where an image is displayed, and the pixels PX are arranged in various suitable formats, for example, such as a matrix, at (e.g., in or on) the display area.

Operation of the pixel of the organic light emitting diode display according to an exemplary embodiment will be described with reference to FIG. 1 and FIG. 2.

During an initialization section (e.g., an initialization period), a previous scan signal Sn−1 of a low level is supplied to the pixel PX through the previous scan line 152. Then, the fourth transistor T4, which has received the previous scan signal Sn−1 of the low level, is turned on, and thus, the initialization voltage Vint is applied to the gate electrode G1 of the driving transistor T1 and the second storage electrode E2 of the storage capacitor Cst through the fourth transistor T4. Thus, the driving transistor T1 and the storage capacitor Cst are initialized. Because the initialization voltage Vint has a low voltage value, the driving transistor T1 may be turned on.

During the initialization section, a bypass signal GB of a low level is also applied to the seventh transistor T7. The seventh transistor T7, which has received the bypass signal GB of the low level, is turned on, and thus, the initialization voltage Vint is applied to the anode of the organic light emitting diode OLED through the seventh transistor T7. Thus, the anode of the organic light emitting diode OLED is initialized.

Afterwards, the scan signal Sn of the low level is supplied to the pixel PX through the scan line 151 during a data writing section (e.g., a data writing period) (hereinafter, which may also be referred to as a writing section or a writing period). The second transistor T2, the third transistor T3, and the ninth transistor T9 are turned on by the scan signal Sn of the low level.

When the second transistor T2 is turned on, the data voltage Dm is input to the first electrode S1 of the driving transistor T1 through the second transistor T2.

In addition, the third transistor T3 is turned on during the data writing section, and thus, the second electrode D2 of the driving transistor T1 is electrically connected with the gate electrode G1 of the driving transistor T1 and the second storage electrode E2 of the storage capacitor Cst. The gate electrode G1 and the second electrode D2 of the driving transistor T1 are connected to each other such that the driving transistor T1 is diode-connected. In addition, the driving transistor T1 is in the turn-on state because a low voltage e.g., the initialization voltage Vint) is applied during the initialization section. Accordingly, the data voltage Dm input to the first electrode S1 of the driving transistor T1 is output from the second electrode D1 of the driving transistor T1 after passing through a channel of the driving transistor T1, and then stored in the second storage electrode E2 of the storage capacitor Cst. In this case, a voltage applied to the second storage electrode E2 is changed according to a threshold voltage Vth of the driving transistor T1, and when the data voltage Dm is applied to the first electrode S1 of the driving transistor T1 and the initialization voltage Vint is applied to the gate electrode G1 of the driving transistor T1, the voltage output to the second electrode D1 of the driving transistor T1 may be Vgs+Vth. Here, because of a voltage difference between the gate electrode G1 of the driving transistor T1 and the first electrode S1 of the driving transistor, Vgs may have a value of Dm−Vint. Therefore, a voltage output from the second electrode D1 of the driving transistor T1 and stored in the second storage electrode E2 of the storage capacitor Cst may have a value of Dm−Vint+Vth.

In addition, during the data writing section, the ninth transistor T9 is turned on, and the initialization voltage Vint is applied to the overlapping layer M1. Because the overlapping layer M1 may also be another gate electrode (e.g., a second gate electrode) of the driving transistor T1, when the initialization voltage Vint is applied to the overlapping layer M1, characteristics of the driving transistor T1 may be changed. This will be described in more detail below with reference to FIG. 3.

Afterwards, during a light emission section (e.g., a light emission period), the light emission control signal EM supplied from the light emission control line 153 has a low level value, and thus, the fifth transistor T5, the sixth transistor T6, and the eighth transistor T8 are turned on.

Because the fifth transistor T5 and the sixth transistor T6 are turned on, the driving voltage ELVDD is applied to the first electrode S1 of the driving transistor T1, and the second electrode D1 of the driving transistor T1 is connected with the organic light emitting diode OLED. A driving current Id is generated in the driving transistor T1 according to a voltage difference between the voltage of the gate electrode G1 of the driving transistor T1 and the voltage (e.g., the driving voltage ELVDD) of the first electrode S1 of the driving transistor T1. The driving current Id of the driving transistor T1 may have a value that is proportional to a square of Vgs-Vth. Here, the value of Vgs is equal to or substantially equal to a voltage difference at opposite ends of the storage capacitor Cst, and equals or substantially equals Vg−Vs, and thus, Vgs has a value of (Dm−Vint+Vth−ELVDD). Here, a value of Vgs-Vth is obtained by subtracting the value of Vth such that Vgs has a value of Dm-Vint-ELVDD. In other words, the driving current Id of the driving transistor T1 has a current independent of the threshold voltage Vth of the driving transistor T1 as an output.

Therefore, although the driving transistor T1 located in each pixel PX may have a different threshold voltage Vth due to a process variation, an output current of the driving transistor T1 may be constant or substantially constant, thereby enhancing non-uniformity of characteristics.

In the above described calculation formula, the Vth value may have a slightly larger value than 0, or a negative value in the case of a P-type transistor using a polycrystalline semiconductor. In addition, the expression of + and − may be changed according to a direction in which a voltage is calculated. However, there is no change in the fact that the driving current Id, which is an output current of the driving transistor T1, has a value independent of the threshold voltage Vth.

In addition, during the light emission section, the eighth transistor T8 is also turned on, and thus, applies the driving voltage ELVDD to the overlapping layer M1. The overlapping layer M1 may be another gate electrode (e.g., a second gate electrode) of the driving transistor T1, and thus, when the driving voltage ELVDD is applied to the overlapping layer M1, characteristics of the driving transistor T1 may be changed. This will be described in more detail below with reference to FIG. 3.

When the light emission section is terminated, the initialization section begins again, such that the same or substantially the same operation described with reference to FIG. 2 repeats from the beginning.

One of a first electrode and a second electrode of each of the plurality of transistors T1, T2, T3, T4, T5, T6, T7, T8, and T9 may be a source electrode and the other thereof may be a drain electrode depending on an application direction of a voltage or current.

In some embodiments, the seventh transistor T7 initializes the anode of the organic light emitting diode OLED during the initialization section, and thus, a small amount of current discharged from the driving transistor T1 in a condition that the driving transistor T1 is not actually turned on may be prevented or substantially prevented from flowing toward the organic light emitting diode OLED. In this case, the small amount of current is a bypass current Ibp, which is discharged to the initialization voltage Vint end through the seventh transistor T7. Thus, the organic light emitting diode OLED may not emit unnecessary light, thereby displaying a more vivid black grayscale (e.g., a more vivid black gray level) and improving a contrast ratio. In such a case, a bypass signal GB may be a signal having a timing that is different from that of the previous stage scan signal Sn−1. However, the present disclosure is not limited thereto, and depending on the exemplary embodiments, the seventh transistor T7 may be omitted.

A voltage applied to the overlapping layer M1 in the pixel PX operating as described above may change the characteristics of the driving transistor T1. Therefore, the driving transistor T1 may have different characteristics during the writing section and the light emission section.

Such a characteristic change will be described in more detail with reference to FIG. 3.

Figure 3:
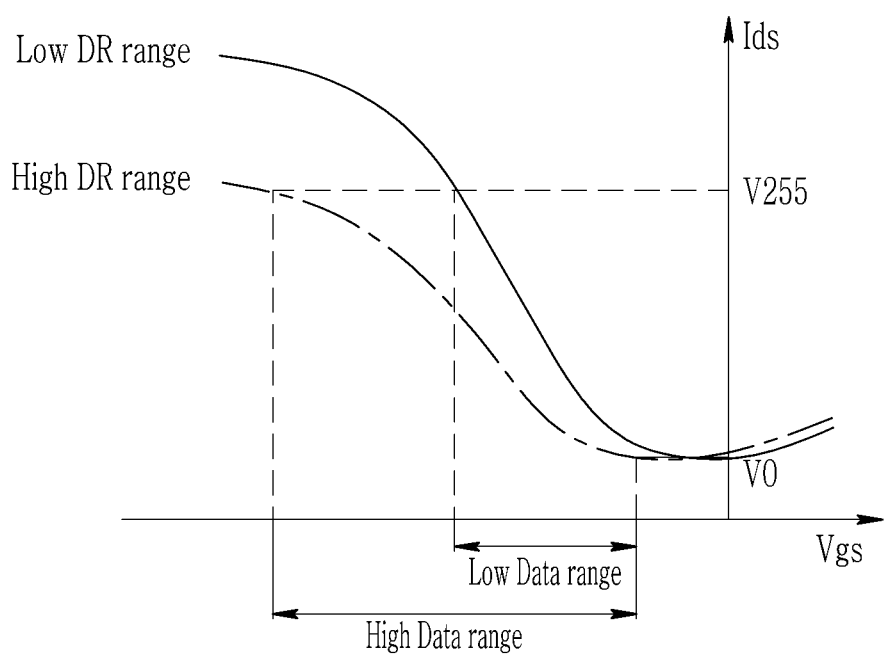
FIG. 3 is a graph that illustrates a characteristic change of the driving transistor in the organic light emitting diode display according to an exemplary embodiment.

FIG. 3 is a graph that illustrates a characteristic change of the driving transistor in the organic light emitting diode display according to an exemplary embodiment.

In FIG. 3, the horizontal axis denotes a gate-source voltage Vgs of the driving transistor T1, and the vertical axis denotes a current Ids flowing to the driving transistor T1. In FIG. 3, V0 and V255 are displayed in the vertical axis, and denote a current value that expresses the minimum grayscale (e.g., 0 grayscale or gray value) and a current value that expresses the maximum grayscale (e.g., 255 grayscale or gray value), respectively, with reference to 256 grayscales (e.g., 256 gray values).

The two curves shown in FIG. 3 are distinguished as a "Low DR range" and a "High DR range". The "Low DR range" curve illustrates a characteristic of the driving transistor T1 when the initialization voltage Vint is applied to the overlapping layer M1 that overlaps with the driving transistor T1. The "High DR range" curve illustrates a characteristic of the driving transistor T1 when the driving voltage ELVDD is applied to the overlapping layer M1 that overlaps with the driving transistor T1.

In addition, the expression "data range" as used with reference to FIG. 3 implies a gap between a gate-source voltage Vgs for providing a current value that displays the minimum grayscale and a gate-source voltage Vgs for providing a current value that displays the maximum grayscale.

As shown in FIG. 3, when the initialization voltage Vint is applied to the overlapping layer M1, the graph slope of the driving transistor T1 decreases rapidly as the gate-source voltage Vgs increases. As a result, the gate-source voltage Vgs that may supply the current value used at the maximum grayscale (255 grayscale; V255) increases, and the data range decreases. (Low Data range).

On the other hand, when the driving voltage ELVDD is applied to the overlapping layer M1, the graph slope of the driving transistor T1 decreases relatively gradually as the gate-source voltage Vgs is increased. As a result, the gate-source voltage that may supply the current value used at the maximum grayscale (255 grayscale: V255) is maintained or substantially maintained at a relatively small value, and the data range is maintained or substantially maintained to be large. (High Data range).

The characteristics of these two driving transistors T1 exhibit a more desirable effect when they meet the writing section and the light emission section.

In other words, during the writing section, the initialization voltage Vint is applied to the overlapping layer M1, and thus, the driving transistor T1 has a low data range. Accordingly, even when the gate-source voltage Vgs is slightly changed, an output is increased, and thus, the data voltage may be well charged to the capacitor (e.g., the storage capacitor Cst).

Further, during the light emission section, the driving voltage ELVDD is applied to the overlapping layer M1, and thus, the driving voltage T1 has a high data range. Accordingly, the output of the driving transistor T1 is changed less sensitively to the change of the gate-source voltage Vgs. As a result, changes in the output according to the characteristics of each driving transistor T1 may become less sensitive. Therefore, the change in the light emitting characteristic during the light emission section may be reduced according to the position of the pixel, and the display quality may become uniform or substantially uniform.

Hereinafter, another exemplary embodiment will be described with reference to FIG. 4.

Figure 4:
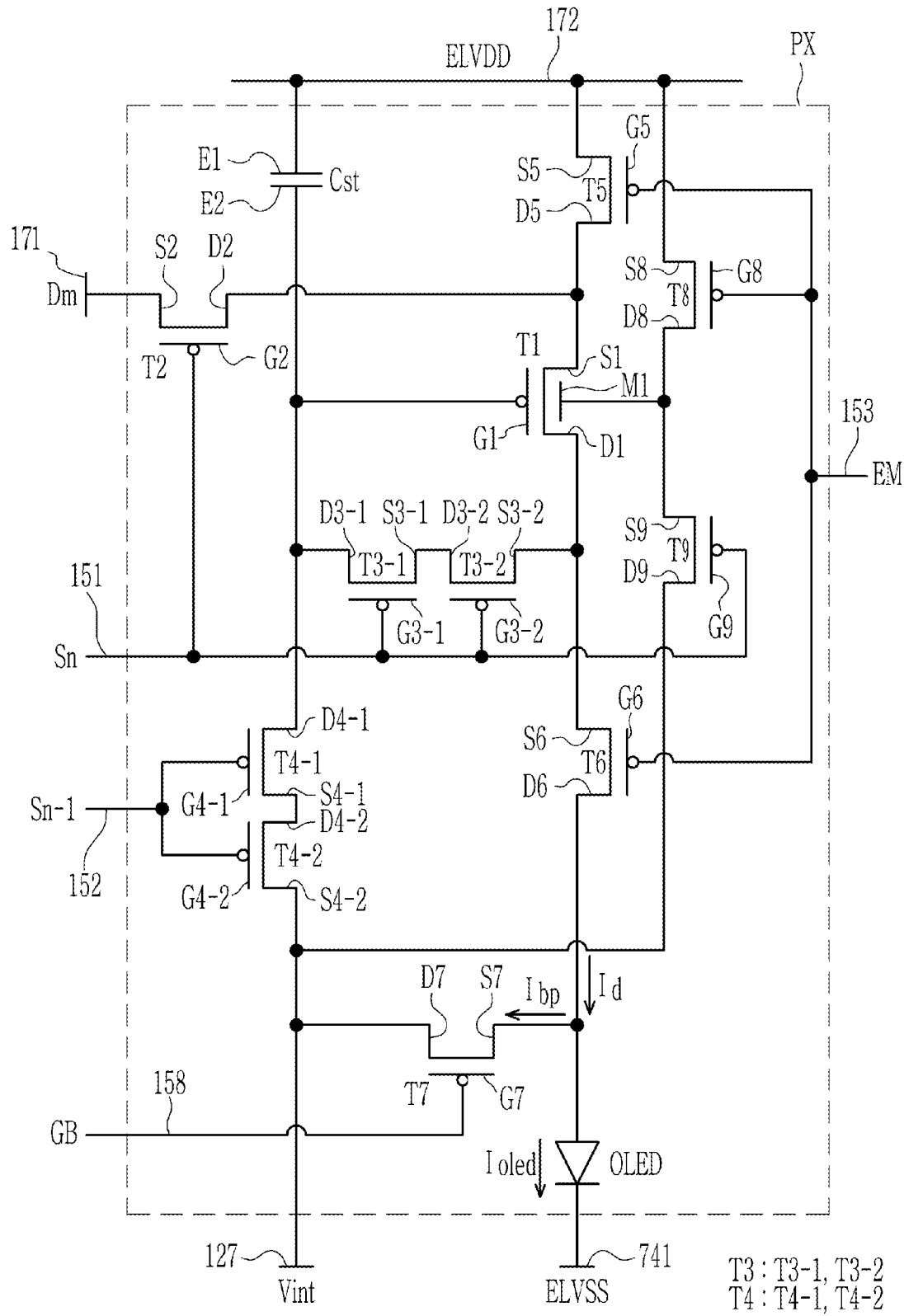
FIG. 4 is an equivalent circuit diagram of a pixel of an organic light emitting diode display according to another exemplary embodiment.

FIG. 4 is an equivalent circuit diagram of a pixel of an organic light emitting diode display according to another exemplary embodiment.

The circuit diagram of FIG. 4 may be different from the circuit diagram of FIG. 1, in that a third transistor T3 and a fourth transistor T4 of FIG. 4 may each include a plurality of transistors. Accordingly, redundant description between the embodiments of FIGS. 1 and 4 may not be repeated, and the differences therebetween may be mainly described.

The third transistor T3 according to the exemplary embodiment of FIG. 4 is formed of a 3-1 transistor T3-1 and a 3-2 transistor T3-2. In this case, a gate electrode G3-1 of the 3-1 transistor T3-1 and a gate electrode G3-2 of the 3-2 transistor T3-2 are connected to each other, and a first electrode S3-1 of the 3-1 transistor T3-1 and a second electrode D3-2 of the 3-2 transistor T3-2 are connected with each other. A first electrode of S3-2 of the 3-2 transistor T3-2 is connected with the second electrode D1 of the driving transistor T1, and a second electrode D3-1 of the 3-1 transistor T3-1 is connected with the second storage electrode E2 of the storage electrode Cst and the gate electrode G1 of the driving transistor T1.

The gate electrodes of the two transistors T3-1 and T3-2 are connected to each other and receive the same signal, and thus, an output of one transistor is applied as an input of the other transistor.

The fourth transistor T4 according to the exemplary embodiment of FIG. 4 is formed of a 4-1 transistor T4-1 and a 4-2 transistor T4-2. In this case, a gate electrode G4-1 of the 4-1 transistor T4-1 and a gate electrode G4-2 of the 4-2 transistor T4-2 are connected to each other, and a first electrode S4-1 of the 4-1 transistor T4-1 and a second electrode D4-2 of the 4-2 transistor T4-2 are connected to each other. A first electrode S4-2 of the 4-2 transistor T4-2 is connected with the initialization voltage line 127, and a second electrode D4-1 of the 4-1 transistor T4-1 is connected to the second storage electrode E2 of the storage capacitor Cst and the gate electrode G1 of the driving transistor T1.

The gate electrodes of the two transistors T4-1 and T4-2 are connected to each other and receive the same signal, and thus, an output of one of the two transistors is applied as an input of the other transistor.

As described, when two transistors are included, there is a merit of reducing a leakage characteristic of the transistor.

In the exemplary embodiment of FIG. 4, both the third transistor T3 and the fourth transistor T4 include two transistors, but the present disclosure is not limited thereto, and in another embodiment, only one of the third transistor T3 or the fourth transistor T4 may include two transistors.

Hereinafter, an alignment view and a cross-sectional view of a pixel PX having the structure of FIG. 4 according to an example will be described with reference to FIG. 5 and FIG. 6.

Figure 5:
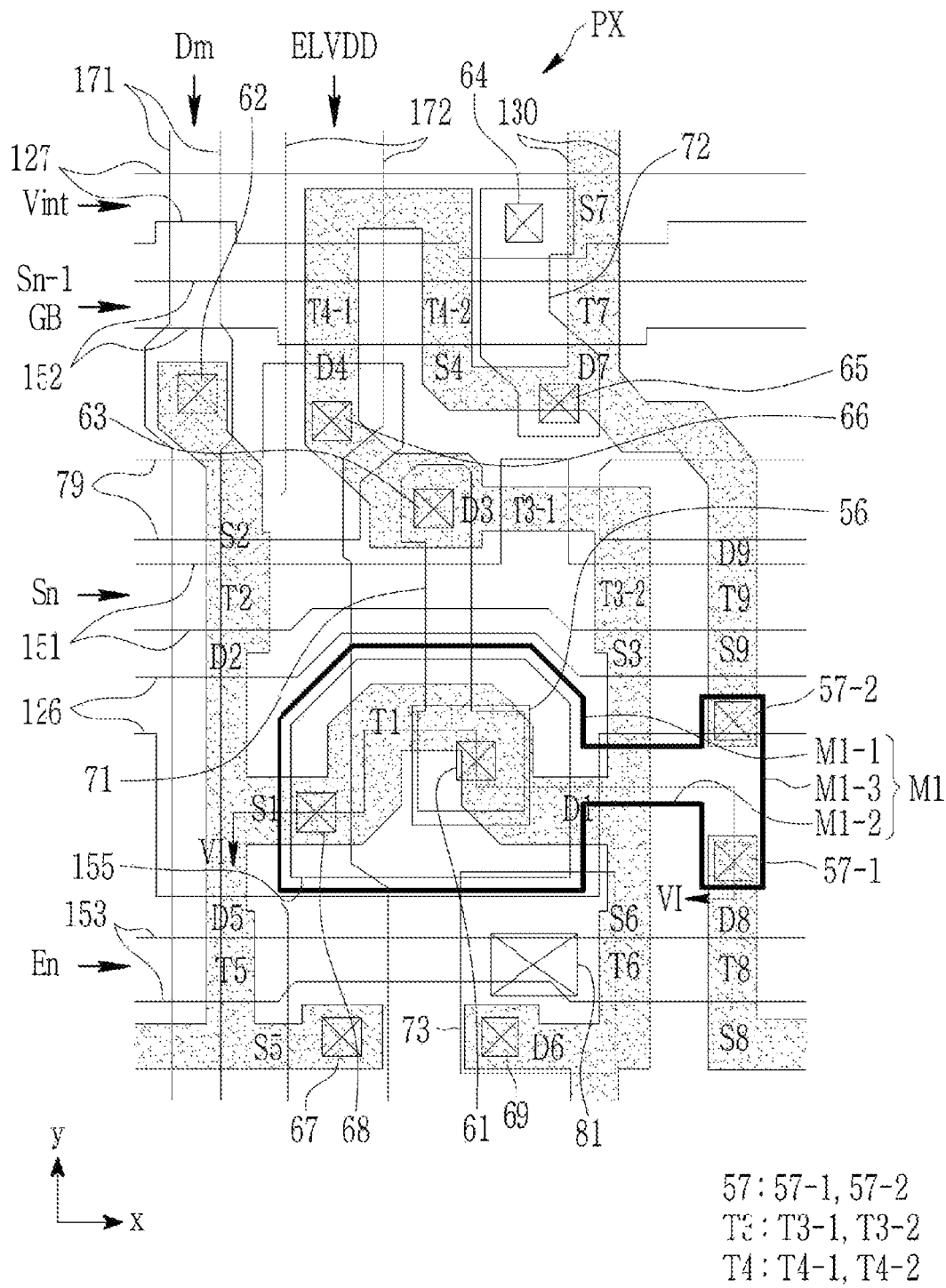
FIG. 5 is a layout view of one pixel area of an organic light emitting diode display according to an exemplary embodiment.
Figure 6:
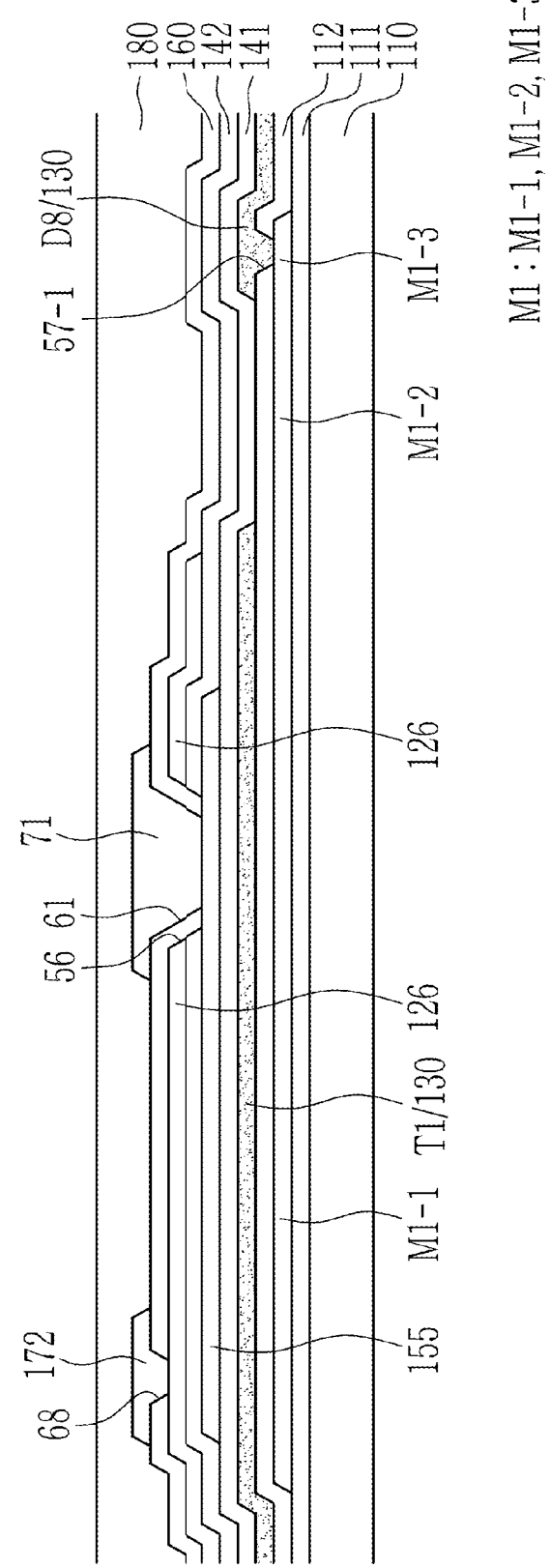
FIG. 6 is a cross-sectional view taken along the line VI-VI of FIG. 5.

FIG. 5 is a layout view of one pixel area of an organic light emitting diode display according to an exemplary embodiment, and FIG. 6 is a cross-sectional view taken along the line VI-VI of FIG. 5.

Referring to FIG. 5 and FIG. 6, an organic light emitting diode display according to the present exemplary embodiment includes scan lines 151, previous scan lines 152, light emission control lines 153, and initialization voltage lines 127 that extend substantially in a first direction x, and transmit a scan signal Sn, a previous scan signal Sn−1, a light emission control signal EM, and an initialization voltage Vint, respectively. A bypass signal GB is transmitted through the previous scan line 152. The organic light emitting diode display includes data lines 171 and driving voltage lines 172 that extend in a second direction y that crosses the first direction x.

The organic light emitting diode display includes a driving transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and an organic light emitting diode OLED.

In addition, the organic light emitting diode display according to the exemplary embodiment of FIG. 5 and FIG. 6 includes an overlapping layer M1 that is formed of a metal having a conductive property, or formed of a semiconductor material equivalent thereto. In FIG. 5, the overlapping layer M1 in is shown by a thick line.

The overlapping layer M1 includes a contact portion M1-3, an extension portion M1-2, and an expansion portion M1-1. The overlapping portion M1-1 is formed to overlap with a channel and a gate electrode 155 of the driving transistor T1. The contact portion M1-3 is a portion that is electrically connected with the eighth transistor T8 and the ninth transistor T9, and the expansion portion M1-1 and the contact portion M1-3 are connected with each other through the extension portion M1-2.

Referring to FIG. 6, the overlapping layer M1 is disposed between a substrate 110 that is formed of glass, plastic, or a polyimide (PI), and a semiconductor layer. In addition, the overlapping layer M1 overlaps with the channel of the driving transistor T1 on a plane, and may be at least partially overlapped with a first electrode and a second electrode of the driving transistor T1. In addition, because the gate electrode 155 of the driving transistor T1 is disposed on the semiconductor layer, the overlapping layer M1 and the gate electrode 155 also overlap with each other.

A channel of each of the driving transistor T1, the second transistor T2, the third transistor T3, the fourth transistor T4, the fifth transistor T5, the sixth transistor T6, the seventh transistor T7, the eighth transistor T8, and the ninth transistor T9 is disposed in a semiconductor layer 130 that is elongated. In addition, at least a part of a first electrode and a second electrode of each of the plurality of transistors T1, T2, T3, T4, T5, T6, T7, T8, and T9 are disposed in the semiconductor layer 130. The semiconductor layer 130 (e.g., corresponding to the shaded portion in FIG. 5, which is the same hereinafter) may be formed by bending into various shapes. The semiconductor layer 130 may include a polycrystalline semiconductor, for example, such as polysilicon, or an oxide semiconductor.

The semiconductor layer 130 includes a channel doped with an N-type impurity or a P-type impurity, and a first doped region and a second doped region that are disposed at opposite sides of the channel. The first doped region and the second doped region may be doped with an impurity at a concentration that is higher than that of the channel. The first doped region and second doped region correspond to the first electrode and the second electrode, respectively, of each of the plurality of transistors T1, T2, T3, T4, T5, T6, T7, T8, and T9. When one of the first doped region and the second doped region is a source region, the other thereof corresponds to a drain region. In addition, a region between a first electrode and a second electrode of different transistors is doped, and thus, the two transistors may be electrically connected with each other.

A planar shape (e.g., a shape when viewed in a plan view) of the semiconductor layer 130 according to the exemplary embodiment of FIG. 5 is described as follows.

The channel of the driving transistor T1 has a horseshoe shape, and the first electrode S1 and the second electrode D1 of the driving transistor T1 are positioned on respective sides of the channel.

The semiconductor layer 130 extends vertically (e.g., in the second direction y) in the first electrode S1, and the channel of the second transistor T2 is disposed at (e.g., in or on) a portion of the semiconductor layer 130 extending upward (e.g., in the second direction y) in the first electrode S1. A portion of the semiconductor layer 130 extending downward in the first electrode S1 horizontally (e.g., in the first direction x) extends again after passing through the channel of the fifth transistor T5, and a portion of the semiconductor layer 130 extended to the left extends upward again such that the channel of the eighth transistor T8 (e.g., of an adjacent pixel) is located therein.

In addition, the semiconductor layer 130 also vertically extends in the second electrode D1, and a portion of the semiconductor layer 130 that is extended downward is bent to the left after passing through the channel of the sixth transistor T6. A portion of the semiconductor layer 130 that is extended upward in the second electrode D1 is also bent to the left, and a channel of a 3-2 transistor T3-2 and a channel of a 3-1 transistor T3-1 are located at (e.g., in or on) the bent portion. Then, the semiconductor layer 130 is bent upward again and then bent downward, and a channel of a 4-1 transistor T4-1 and a channel of a 4-2 transistor T4-2 are located in the portion bent downward. After that, the semiconductor layer 130 extends to the right, and then is divided into two branches. One of the two branches of the semiconductor layer 130 passes through the channel of the seventh transistor T7 while extending upward, and thus, is connected with a sixth transistor T6 of an adjacent pixel PX disposed above. The other branch is bent while extending obliquely downward, and thus, extends in a direction that is parallel or substantially parallel with the channel of the 3-2 transistor T3-2, and the channel of the ninth transistor T9 is located at (e.g., in or on) the corresponding position.

However, the present disclosure is not limited thereto, and such a detailed structure of the semiconductor layer 130 may be variously modified depending on exemplary embodiments.

The channel of each of the plurality of transistors T1, T2, T3, T4, T5, T6, T7, T8, and T9 overlaps with a corresponding gate electrode of each of the plurality of transistors T1, T2, T3, T4, T5, T6, T7, T8, and T9, and is located between a corresponding first electrode and a corresponding second electrode of each of the plurality of transistors T1, T2, T3, T4, T5, T6, T7, T8, and T9. The plurality of transistors T1, T2, T3, T4, T5, T6, T7, T8, and T9 may have the same or substantially the same layered structure as each other. Hereinafter, the driving transistor T1 will be described in more detail, and the other remaining transistors T2, T3, T4, T5, T6, T7, T8, and T9 may be briefly described.

The driving transistor T1 includes the channel, the gate electrode 155, the first electrode S1, and the second electrode D1. The channel of the driving transistor T1 is disposed between the first electrode S1 and the second electrode D1, and overlaps with the gate electrode 155 on a plane. The channel is curved such that a length of the channel (e.g., in the first direction x) may be extended in a limited area. As the length of the channel is increased, a driving range of a gate voltage Vg applied to the gate electrode 155 of the driving transistor T1 is widened (e.g., is increased), and a driving current Id constantly increases according to the gate voltage Vg. Accordingly, grayscales of light emitted from the organic light emitting diode OLED may be more finely controlled by changing the magnitude of the gate voltage Vg, and thus, display quality of the organic light emitting diode display may be improved. In addition, because the channel extends in multiple directions rather than extending in one direction, there may also be a merit in which an influence of a direction in a manufacturing process is canceled, and an effect of a process dispersion is reduced. Thus, it may be possible to prevent or substantially prevent image quality deterioration, for example, such as spot defects (e.g., a luminance difference that may occur depending on the pixels even when the same data voltage Dm is applied), that may occur due to a difference in the characteristics of the driving transistor T1 according to the region of the display device due to a process dispersion. However, the present disclosure is not limited thereto, and such a shape of the channel may be variously modified rather than being limited to the horseshoe shape Ω, for example, such that a straight shape or an S-shaped shape of the channel are also possible.

The gate electrode 155 and the overlapping layer M1 overlap with the channel on a plane. In the exemplary embodiment of FIG. 5, the expansion portion M1-1 of the overlapping layer M1 is formed to be wider than the gate electrode 155. The gate electrode 155 is disposed above the semiconductor layer 130, and the overlapping layer M1 is disposed between the semiconductor layer 130 and the substrate 110. The first electrode S1 and the second electrode S2 of the driving transistor T1 are respectively disposed at opposite sides of the channel. An expansion portion of a driving voltage horizontal line 126 is positioned on, and insulated from, the gate electrode 155. The overlapping layer M1 also overlaps with the expansion portion of the driving voltage horizontal line 126 in a plan view. The expansion portion of the driving voltage horizontal line 126 forms the storage capacitor Cst by overlapping with the gate electrode 155 on a plane, with a second gate insulating layer 142 therebetween. The expansion portion of the driving voltage horizontal line 126 forms a first electrode (e.g., E1 in FIG. 1) of the storage capacitor Cst, and the gate electrode 155 forms a second storage electrode (e.g., E2 in FIG. 1). An opening 56 is formed in the expansion portion of the driving voltage horizontal line 126, and thus, the gate electrode 155 is connected with a first data connection member 71 therethrough. A top surface of the gate electrode 155 and the first data connection member 71 are electrically connected with each other through an opening 61 in the opening 56. The first data connection member 71 is connected with the second electrode D3 of the third transistor T3, and thus, connects the gate electrode 155 of the driving transistor T1 and the second electrode D3 of the third transistor T3 to each other.

A gate electrode of the second transistor T2 may be a part of the scan line 151. The data line 171 is connected to a first electrode S2 of the second transistor T2 through an opening 62, and the first electrode S2 and a second electrode D2 of the second transistor T2 may be located on the semiconductor layer 130.

The third transistor T3 may be formed of two adjacent transistors. In other words, the third transistor T3 is marked with the 3-1 transistor T3-1 and the 3-2 transistor T3-2 at the left and below, respectively, with reference to a portion where the semiconductor layer 130 is bent in the pixel PX shown in FIG. 5. The two portions (e.g., T3-1 and T3-2) are combined to serve as the third transistor T3, and a first electrode of one of the third transistors T3 is connected with a second electrode of the other third transistor T3. Gate electrodes of the two transistors T3-1 and T3-2 may be portions that are protruded upward from the scan line 151, or a part of the scan line 151. Such a structure may serve to prevent or substantially prevent a leakage current from flowing. A first electrode S3 of the third transistor T3 is connected with a first electrode S6 of the sixth transistor T6 and the second electrode D1 of the driving transistor T1. A second electrode D3 of the third transistor T3 is connected with the first data connection member 71 through an opening 63.

The fourth transistor T4 is formed of two fourth transistors T4-1 and T4-2, and the two fourth transistors T4-1 and T4-2 are formed at (e.g., in or on) portions where the previous scan line 152 and the semiconductor layer 130 meet (e.g., overlap with each other). Gate electrodes of the two fourth transistors T4-1 and T4-2 may be a part of the previous scan line 152. A first electrode of one of the fourth transistors T4 is connected with a second electrode of the other fourth transistor T4. Such a structure may serve to prevent or substantially prevent a leakage current from flowing. A first electrode S4 of the fourth transistor T4 is connected with a second data connection member 72 through an opening 65, and a second electrode D4 of the fourth transistor T4 is connected with the first data connection member 71 through the opening 63. The first electrode S4 of the fourth transistor T4 is connected with a second electrode D7 of the seventh transistor T7 and a second electrode D9 of the ninth transistor T9.

As described above, the third transistor T3 and the fourth transistor T4 each includes two transistors, and thus, in the off state, it may be possible to effectively prevent or substantially prevent a leakage current by blocking the electron movement path of the channels of the third transistor T3 and the fourth transistor T4.

A gate electrode of the fifth transistor T5 may be a part of the light emission control line 153. The driving voltage line 172 is connected to a first electrode S5 of the fifth transistor T5 through an opening 67, and a second electrode D5 of the fifth transistor T5 is connected with the first electrode S1 of the driving transistor T1 through the semiconductor layer 130. In addition, the first electrode S5 of the fifth transistor T5 is connected with a first electrode S8 of the eighth transistor T8.

A gate electrode of the sixth transistor T6 may be a part of the light emission control line 153. A second electrode D6 of the sixth transistor T6 is connected with a third data connection member 73 through an opening 69, and a first electrode S6 of the sixth transistor T6 is connected with the second electrode D1 of the driving transistor T1 through the semiconductor layer 130.

A gate electrode of the seventh transistor T7 may be a part of the previous scan line 152. A first electrode S7 of the seventh transistor T7 is connected with a third data connection member 73 through an opening 81, and a second electrode D7 may be connected with the first electrode S4 of the fourth transistor T4. The second electrode D7 of the seventh transistor T7 is also connected with a second electrode D9 of the ninth transistor T9.

The storage capacitor Cst includes the first storage electrode E1 and the second storage electrode E2 that overlap each other, with the second gate insulating layer 142 therebetween. The second storage electrode E2 may correspond to the gate electrode 155 of the driving transistor T1, and the first storage electrode E1 may be an expanded portion of the driving voltage horizontal line 126. In this case, the second gate insulating layer 142 may include a dielectric material, and a capacitance is determined by charges charged in the storage capacitor Cst and a voltage between the first and second storage electrodes E1 and E2. By using the gate electrode 155 as the second storage electrode E2, a space for forming the storage capacitor Cst may be assured in a space that is decreased (e.g., that is narrowed) due to the channel of the driving transistor T1, which occupies a relatively large area in the pixel.

The driving voltage line 172 is connected to the first storage electrode E1 through an opening 68. Thus, the storage capacitor Cst stores a charge that corresponds to the driving voltage ELVDD transmitted to the first storage electrode E1 through the driving voltage line 172, and the gate voltage Vg of the gate electrode 155.

The second data connection member 72 is connected with the initialization voltage line 127 through an opening 64. A pixel electrode is connected to the third data connection member 73 through the opening 81.

A parasitic capacitor control pattern 79 may be disposed between the dual gates of the third transistor T3. A parasitic capacitor is present in each pixel, and image quality characteristics may be changed when a voltage applied to the parasitic capacitor is changed. The driving voltage line 172 is connected to the parasitic capacitor control pattern 79 through an opening 66. Thus, the driving voltage ELVDD, which is a constant or substantially constant direct current, is applied to the parasitic capacitor to thereby prevent or substantially prevent the image display characteristics from changing. However, the present disclosure is not limited thereto, and the parasitic capacitor control pattern 79 may be positioned in a different region from that illustrated in FIG.

5, or a voltage other than the driving voltage ELVDD may be applied to the parasitic capacitor control pattern 79.

Referring to FIG. 6, the cross-sectional structure of the organic light emitting diode display according to an exemplary embodiment will be described according to a stacking order thereof.

In FIG. 6, a cross-sectional view taken along the line VI-VI in FIG. 5 corresponding to a portion of the overlapping layer M1 in the organic light emitting diode display is illustrated. Thus, a cross-sectional layered structure of an organic light emitting diode display according to an exemplary embodiment will be first described, and then the layered relationship of a portion thereof will be described in more detail with reference to FIG. 6.

The organic light emitting diode display according to an exemplary embodiment uses a substrate 110 that is formed of a suitable material, for example, such as glass, plastic, or a polyimide (PI). A barrier layer 111 is disposed on the substrate 110, and the overlapping layer M1 that is formed of a metal having a conductive property, or formed of a semiconductor material equivalent thereto, is disposed on the barrier layer 111. A buffer layer 112 is disposed on the overlapping layer M1. The barrier layer 111 and the buffer layer 112 may include an inorganic insulation material, for example, such as a silicon oxide, a silicon nitride, an aluminum oxide, and/or the like, and may also include an organic insulation material, for example, such a polyimide, a polyacryl (epoxy added), and/or the like.

The semiconductor layer 130 that includes the channels, the first electrodes, and the second electrodes of the plurality of transistors T1, T2, T3, T4, T5, T6, T7, and T8, T9 is disposed on the buffer layer 112. A first gate insulating layer 141 is disposed on the semiconductor layer 130. A first gate conductor that includes the gate electrodes (e.g., and the second storage electrodes E2) of the plurality of transistors T1, T2, T3, T4, T5, T6, T7, T8, and T9, the scan line 151, the previous scan line 152, and the light emission control line 153 are disposed on the first gate insulating layer 141. The second gate insulating layer 142 that covers the first gate conductor is disposed on the first gate conductor. The first gate insulating layer 141 and the second gate insulating layer 142 may be formed of a silicon nitride, a silicon oxide, an aluminum oxide, and/or the like. A second gate conductor that includes the driving voltage horizontal line 126, the first storage electrode E1, the initialization voltage line 127, and the parasitic capacitor control pattern 79 is disposed on the second gate insulating layer 142.

An interlayer insulating layer 160 is disposed on the second gate conductor. The interlayer insulating layer 160 may be formed of a silicon nitride, a silicon oxide, an aluminum oxide, and/or the like, and may be formed of an organic insulating material. A data conductor that includes the data line 171, the driving voltage line 172, the first data connection member 71, the second data connection member 72, and the third data connection member 73 is disposed on the interlayer insulating layer 160.

A passivation layer 180 that covers the data conductor is disposed on the data conductor. The passivation layer 180, which is also referred to as a planarization layer, may include an organic insulating material. A pixel electrode is disposed on the passivation layer 180. The pixel electrode is connected with the third data connection member 73 through an opening 81 formed in the passivation layer 180. A barrier rib is disposed on the passivation layer 180 and the pixel electrode. The barrier rib includes an opening portion that overlaps with the pixel electrode, and an organic emission layer is disposed in the opening portion. A common electrode is disposed on the organic emission layer and the barrier rib. The pixel electrode, the organic emission layer, and the common electrode form the organic light emitting diode OLED.

Depending on exemplary embodiments, the pixel electrode may be an anode, which is a hole injection electrode, and the common electrode may be a cathode, which is an electron injection electrode. On the other hand, the pixel electrode may be the cathode and the common electrode may be the anode. When holes and electrons are injected from the pixel electrode and the common electrode into the organic emission layer, respectively, excitons formed from combination of the injected hole and electron fall from an exited state to a ground state, and thus, emit light.

The scan line 151, the previous scan line 152, and the light emission control line 153 that form the first gate conductor extend in a horizontal direction, and the driving voltage horizontal line 126 and the initialization voltage line 127 that form the second gate conductor also extend in the horizontal direction. The data line 171 and the driving voltage line 172 that form the data conductor extend in a vertical direction.

The data line 171 is connected with the first electrode of the second transistor T2 through an opening 62 that is formed in the first gate insulating layer 141, the second gate insulating layer 142, and the interlayer insulating layer 160.

The driving voltage line 172 is connected with the first electrode S5 of the fifth transistor T5 through an opening 67 formed in the first gate insulating layer 141, the second gate insulating layer 142, and the interlayer insulating layer 160, is connected with an expansion portion (e.g., the first storage electrode E1) of the driving voltage horizontal line 126 through an opening 68 formed in the interlayer insulating layer 160, and is connected with the parasitic capacitor control pattern 79 through an opening 66 formed in the interlayer insulating layer 160. In addition, the driving voltage line 172 is electrically connected with the overlapping layer M1 through an opening 57 formed in the buffer layer 112, the first gate insulating layer 141, the second gate insulating layer 142, and the interlayer insulating layer 160.

One end of the first data connection member 71 is connected with the gate electrode 155 through an opening 61 formed in the second gate insulating layer 142 and the interlayer insulating layer 160, and the other end is connected with a second electrode D3 of the third transistor T3 and a second electrode D4 of the fourth transistor T4 through an opening 63 formed in the first gate insulating layer 141, the second gate insulating layer 142, and the interlayer insulating layer 160.

One end of the second data connection member 72 is connected with a first electrode S4 of the fourth transistor T4 through an opening 65 formed in the first gate insulating layer 141, the second gate insulating layer 142, and the interlayer insulating layer 160, and the other end is connected with the initialization voltage line 127 through an opening 64 formed in the interlayer insulating layer 160.

The third data connection member (e.g., refer to reference number 73 in FIG. 8) is connected with a second electrode of the sixth transistor T6 through an opening 69 formed in the first gate insulating layer 141, the second gate insulating layer 142, and the interlayer insulating layer 160.

An encapsulation layer that protects the organic light emitting diode OLED is disposed on the common electrode. The encapsulation layer may contact the common electrode, or may be separated from the common electrode. The encapsulation layer may be a thin film encapsulation layer in which an inorganic layer and an organic layer are stacked, and may include a triple layer structure composed of an inorganic layer, an organic layer, and an inorganic layer. A capping layer and a function layer may be disposed between the common electrode and the encapsulation layer.

FIG. 6 illustrates a structure in which the overlapping layer M1 is electrically connected in more detail.

Referring to FIG. 6, the barrier layer 111 is disposed on the substrate 110, and the overlapping layer M1 is disposed on the barrier layer 111. A position of the expansion portion M1-1 of the overlapping layer M1 overlaps with the driving transistor T1 on a plane as shown in FIG. 5. The barrier layer 112 is disposed on the overlapping layer M1. Openings 57-1 and 57-2 are formed in the buffer layer 112, and expose opposite ends of the contact portion M1-3 of the overlapping layer M1, respectively.

The semiconductor layer 130 is disposed on the buffer layer 112, and in FIG. 6, the channel region of the driving transistor T1 and the second electrode D8 of the eighth transistor T8 of the semiconductor layer 130 are illustrated. The second electrode D8 of the eighth transistor T8 is connected with the contact portion M1-3 of the overlapping layer M1 through the opening 57-1.

A structure in which the contact portion M1-3 of the overlapping portion M1 and the semiconductor layer 130 are connected to each other in the opening 57-2 is the same or substantially the same as the structure in the opening 57-1 shown in FIG. 6, and thus, only one structure of the opening 57-1 is illustrated in FIG. 6. In other words, referring to FIG. 5, the first electrode S9 of the ninth transistor T9 is connected with the contact portion M1-3 of the overlapping layer M1 through the opening 57-2 that is formed in the buffer layer 112.

The first gate insulating layer 141 is formed on the channel region of the driving transistor T1, the second electrode D2 of the eighth transistor T8, and the buffer layer 112. The gate electrode 155 of the driving transistor T1 is disposed on the first gate insulating layer 141. The second gate insulating layer 142 is formed on the gate electrode 155 of the driving transistor T1.

The expansion portion of the driving voltage horizontal line 126 is disposed on the second gate insulating layer 142. The second gate insulating layer 142 and the expansion portion of the driving voltage horizontal line 126 include an opening 56, and thus, a portion of the gate electrode 155 disposed therebelow is exposed.

The interlayer insulating layer 160 is disposed on the second gate insulating layer 142 and the expansion portion of the driving voltage horizontal line 126. The openings 61 and 68 are disposed in the interlayer insulating layer 160, and thus, expose the portion of the gate electrode 155 and a portion of the expansion portion of the driving voltage horizontal line 126, respectively.

The first data connection member 71 and the driving voltage line 172 are disposed on the interlayer insulating layer 160. The first data connection member 71 is electrically connected with the gate electrode 155 through the opening 61, and the driving voltage line 172 is electrically connected with the expansion portion 126 through the opening 68.

The passivation layer 180 is disposed on the first data connection member 71 and the driving voltage line 172. The pixel electrode, the organic emission layer, the common electrode, and the encapsulation layer may be disposed on the passivation layer 180.

The overlapping layer M1 according to the exemplary embodiment of FIG. 5 and FIG. 6 receives the driving voltage ELVDD or the initialization voltage Vint when the eighth transistor T8 or the ninth transistor T9 is turned on.

Figure 7:
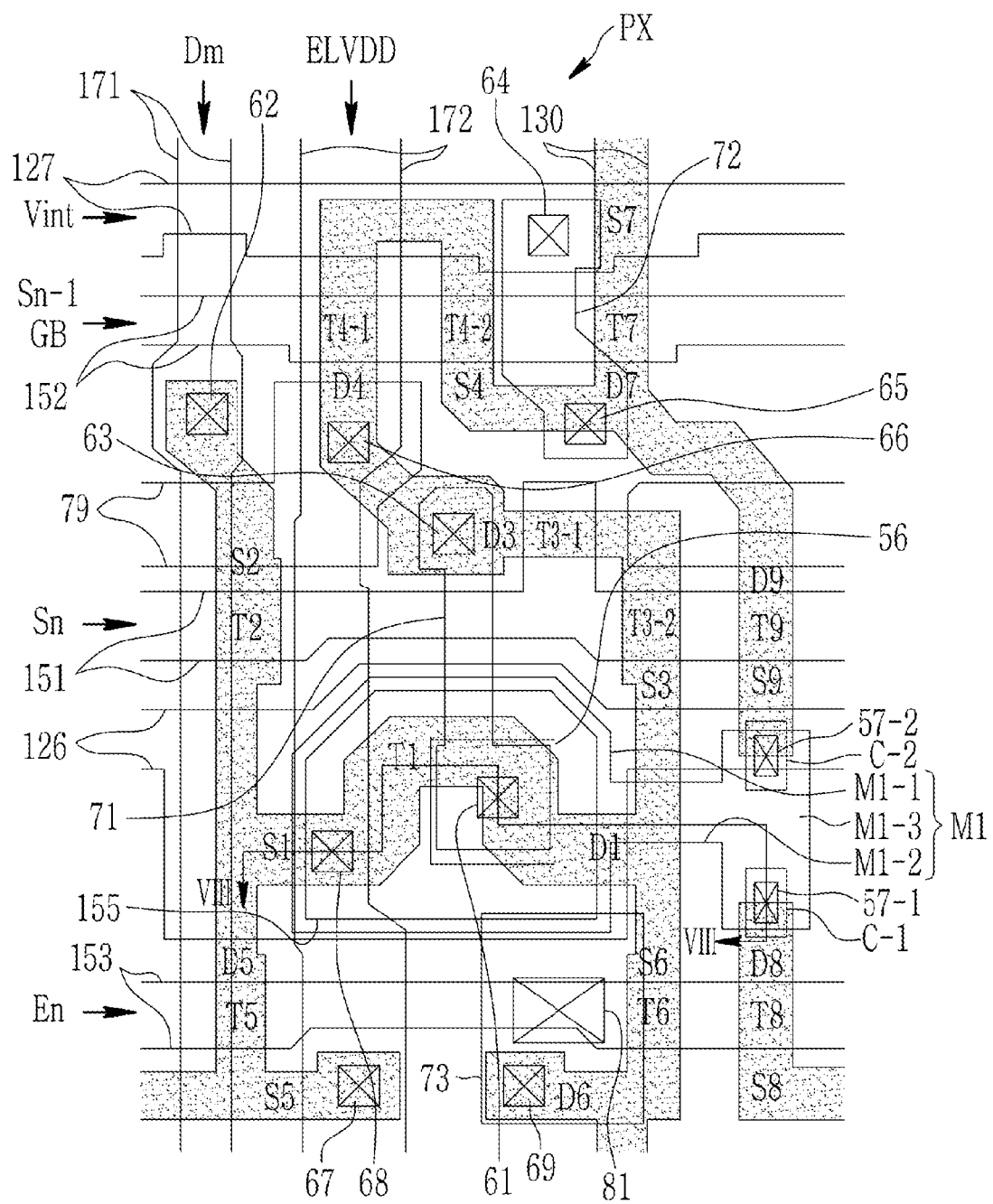
FIG. 7 is a layout view of a pixel area of an organic light emitting diode display according to an exemplary embodiment.
Figure 8:
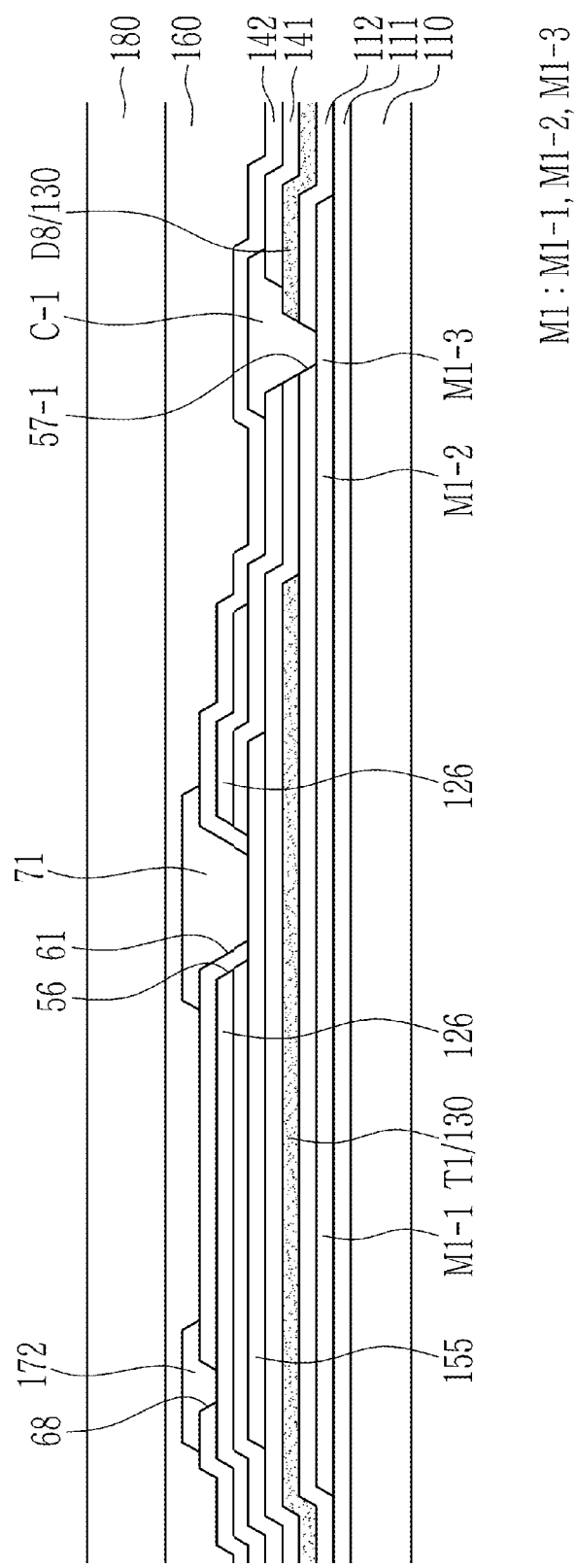
FIG. 8 is a cross-sectional view taken along the line VIII-VIII of FIG. 7.

The overlapping layer M1 having such a characteristic may be connected with the eighth transistor T8 and the ninth transistor T9 with a structure shown in FIG. 7 and FIG. 8.

FIG. 7 is a layout view of a pixel area of an organic light emitting diode display according to an exemplary embodiment, and FIG. 8 is a cross-sectional view taken along the line VIII-VIII of FIG. 7.

In the exemplary embodiment of FIG. 7 and FIG. 8, unlike in the exemplary embodiment of FIG. 5 and FIG. 6, additional connection members C-1 and C-2 are used in the connection of a contact portion M1-3 of an overlapping layer M1 with two transistors T8 and T9.

In FIG. 8, a cross-section of only one additional connection member C-1 from among the two additional connection members C-1 and C-2 is illustrated, because the two additional connection members C-1 and C-2 may have the same or substantially the same cross-sectional structure as each other.

Referring to FIG. 7 and FIG. 8, the contact portion M1-3 of the overlapping layer M1 disposed on the barrier layer 111 is exposed by the buffer layer 112 that is disposed thereon, and the opening 57-1 that is disposed in the first gate insulating layer 141. In addition, the top surface of the second electrode D8 of the eighth transistor T8 of the semiconductor layer 130 disposed on the buffer layer 112 is exposed by the opening 57-1 that is disposed in the first gate insulating layer 141 that covers the second electrode D8. Thus, the contact portion M1-3 exposed by the additional connection portion C-1 that is formed while covering the opening 57-1 of the first gate insulating layer 141, and the second electrode D8 of the eighth transistor T8, are electrically connected to each other.

A connection structure of the contact portion M1-3 and the first electrode S1 of the ninth transistor T9 is the same or substantially the same as that described above, and will be described in more detail hereinafter.

The contact portion M1-3 of the overlapping layer M1 disposed on the barrier layer 111 is exposed by the buffer layer 112 that is disposed on the barrier layer 111, and the opening 57-2 that is disposed on the first gate insulating layer 141. In addition, the top surface of the first electrode S9 of the ninth transistor T9 of the semiconductor layer 130 that is disposed on the buffer layer 112 is exposed by the opening 57-2 that is formed in the first gate insulating layer 141 that covers the first electrode S9. As a result, the contact portion M1-3 exposed by the additional connection member C-2 formed while covering the opening 57-2 of the first gate insulating layer 141, and the first electrode S9 of the ninth transistor T9, are electrically connected to each other.

The additional connection members C-1 and C-2 according to the exemplary embodiment of FIG. 7 and FIG. 8 are formed as a second gate conductor layer. However, the present disclosure is not limited thereto, and the additional connection members C-1 and C-2 may be formed as a first gate conductor layer.

The structure in which the overlapping layer M1 is connected with the eighth transistor T8 and/or the ninth transistor T9, which is different from the structure shown in FIG. 5 and FIG. 6, has been described with reference to FIG. 7 and FIG. 8. However, depending on exemplary embodiments, variously other electrical connections may also be available. For example, depending on exemplary embodiments, the second electrode D8 of the eighth transistor T8 and the first electrode S9 of the ninth transistor T9 may be connected with each other, and may be connected with the overlapping layer M1 through one opening. In this case, a structure in which the semiconductor layer 130 is connected from the second electrode D8 of the eighth transistor T8 to the first electrode S9 of the ninth transistor T9 is also possible.

In one or more of the above exemplary embodiments, the driving voltage ELVDD and the initialization voltage Vint are described as the voltages applied to the overlapping layer M1. However, the present invention is not limited thereto, and depending on the exemplary embodiment, another high voltage and/or low voltage may be used. For example, in some embodiments, as the high voltage and the low voltage, a voltage having a constant or substantially constant amount difference from a threshold voltage Vth of the driving transistor T1 may be used.

In this case, during the writing section, one of the voltages that is lower than the threshold voltage Vth of the driving transistor T1 may be applied to the overlapping layer M1 to have a low data range, and during the light emission section, another one of the voltages that is higher than the threshold voltage Vth of the driving transistor T1 may be applied to the overlapping layer M1 to have a high data range.

Further, depending on exemplary embodiments, a portion that is connected with the overlapping layer M1 through the eighth transistor T8 and the ninth transistor T9 may be formed to be connected with one electrode of one transistor in the pixel PX, instead of with a specific voltage line.

In addition, depending on exemplary embodiments, an exemplary embodiment in which the eighth transistor T8 and/or the ninth transistor T9 is directly connected with the overlapping layer M1 without having an additional connection member is possible.

One or more exemplary embodiments in which the eighth transistor T8 and the ninth transistor T9 are both formed in the pixel PX have been described.

However, depending on exemplary embodiments, the overlapping layer M1 may be connected with one of the two transistors (e.g., with one of the eighth transistor T8 or the ninth transistor T9).

Such a structure will be described in more detail hereinafter.

Figure 9:
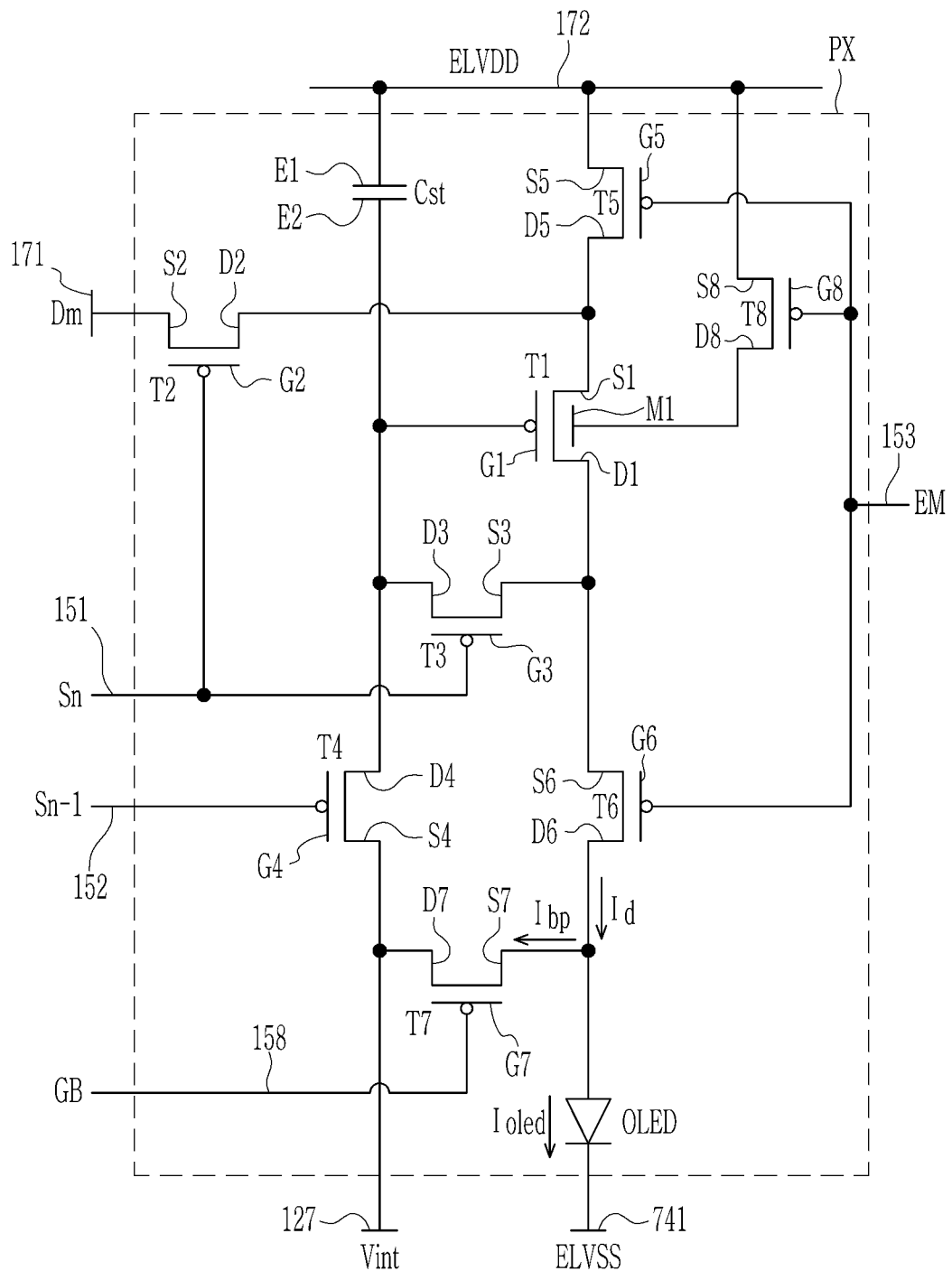
FIG. 9 is an equivalent circuit diagram of a pixel of an organic light emitting diode display according to an exemplary embodiment.
Figure 10:
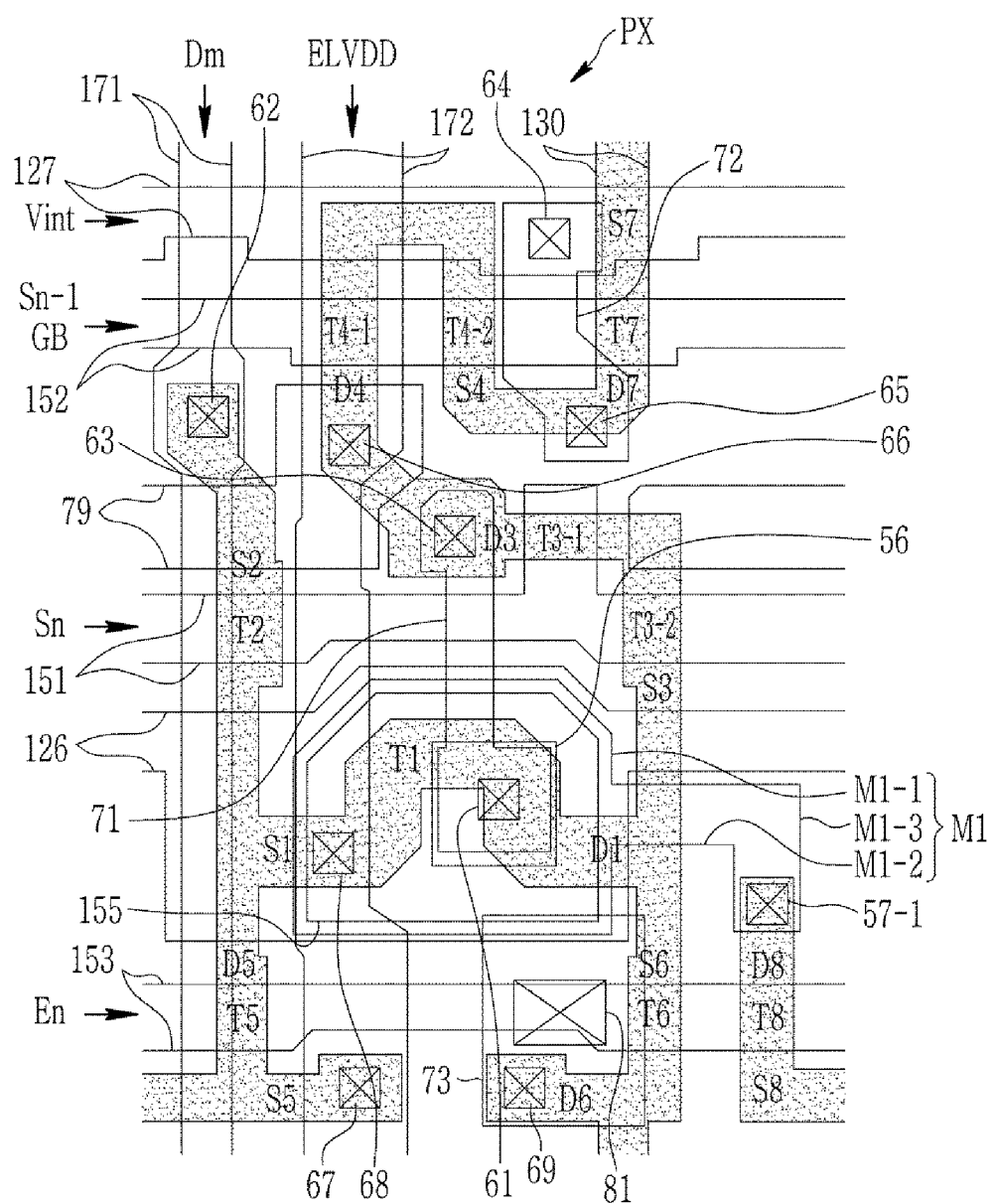
FIG. 10 is a layout view of one pixel area of the organic light emitting diode display according to an exemplary embodiment.

Referring to FIG. 9 and FIG. 10, an exemplary embodiment in which a pixel PX includes the eighth transistor T8 and the overlapping layer M1 without the ninth transistor T9 will be described in more detail.

FIG. 9 is an equivalent circuit diagram of a pixel of an organic light emitting diode display according to an exemplary embodiment.

In FIG. 9, compared with the embodiment of FIG. 1, the ninth transistor T9 and the wires connected to the ninth transistor T9 are omitted. In the exemplary embodiment of FIG. 9, the overlapping layer M1 is connected only with the eighth transistor T8.

In other words, the eighth transistor T8 serves to transmit the driving voltage ELVDD to the overlapping layer M1 overlapping with the driving transistor T1. The gate electrode G8 of the eighth transistor T8 is connected with the light emission control line 153, the first electrode S8 of the eighth transistor T8 is connected with the driving voltage line 172, and the second electrode D8 of the eighth transistor T8 is connected with the overlapping layer M1.

The eighth transistor T8 is turned on concurrently (e.g., simultaneously) with the fifth transistor T5 and the sixth transistor T6 according to the light emission control signal EM transmitted through the light emission control line 153, and transmits the driving voltage ELVDD to the overlapping layer M1.

Because the ninth transistor T9 is not included in the exemplary embodiment of FIG. 9, the initialization voltage Vint is not applied to the overlapping layer M1. As a result, the overlapping layer M1 may be continuously applied with the driving voltage ELVDD when the eighth transistor T8 is turned on. However, the present disclosure is not limited thereto, and the eighth transistor T8 may also be omitted depending on exemplary embodiments, and thus, the overlapping layer M1 may be directly connected with the driving voltage line 172.

The exemplary embodiment of FIG. 9 may be illustrated as a layout view as shown in FIG. 10.

FIG. 10 is a layout view of one pixel area of the organic light emitting diode display according to an exemplary embodiment.

In the exemplary embodiment of FIG. 10, a semiconductor layer 130 extends to the right side after passing through a channel of a 4-1 transistor T4-1 and a channel of a 4-2 transistor T4-2, and passes through a channel of a seventh transistor T7 while extending upward. The semiconductor layer 130 is then connected with a sixth transistor T6 of a pixel PX disposed above the channel of the seventh transistor T7. Accordingly, a channel, a first electrode S9, and a second electrode D9 of a ninth transistor T9 are not formed in the semiconductor layer 130.

In addition, the contact portion M1-3 of the overlapping layer M1 has a structure of being bent downward without expanding upward. Further, the contact portion M1-3 of the overlapping layer M1 is electrically connected with the semiconductor layer 130 where the second electrode D8 of the eighth transistor T8 is positioned by one opening 57-1.

In the exemplary embodiments of FIG. 1 to FIG. 8 in which the eighth transistor T8 and the ninth transistor T9 are both formed, the driving transistor T1 has a low data range due to the initialization voltage Vint applied to the overlapping layer M1 during the writing section, such that a data voltage is well charged to a capacitor, and during the light emission section, the driving transistor T1 has a high data range due to the driving voltage ELVDD applied to the overlapping layer M1 during the light emission section, such that the driving transistor T1 has a merit of being less sensitive to a change in the voltage Vgs between the gate-source of the driving transistor T1.

However, in the exemplary embodiment of FIG. 9 and FIG. 10, no effect caused by the ninth transistor T9 occurs, and because the driving voltage ELVDD is formed in the overlapping layer M1 during the light emission section, the driving transistor T1 has a high data range such that the driving transistor T1 only has a merit of not being sensitive to a change in the voltage Vgs between the gate-source of the driving transistor T1.

Hereinafter, referring to FIG. 11 and FIG. 12, an exemplary embodiment in which a pixel PX includes the ninth transistor T9 and the overlapping layer M1 without the eight transistor T8 will be described in more detail.

Figure 11:
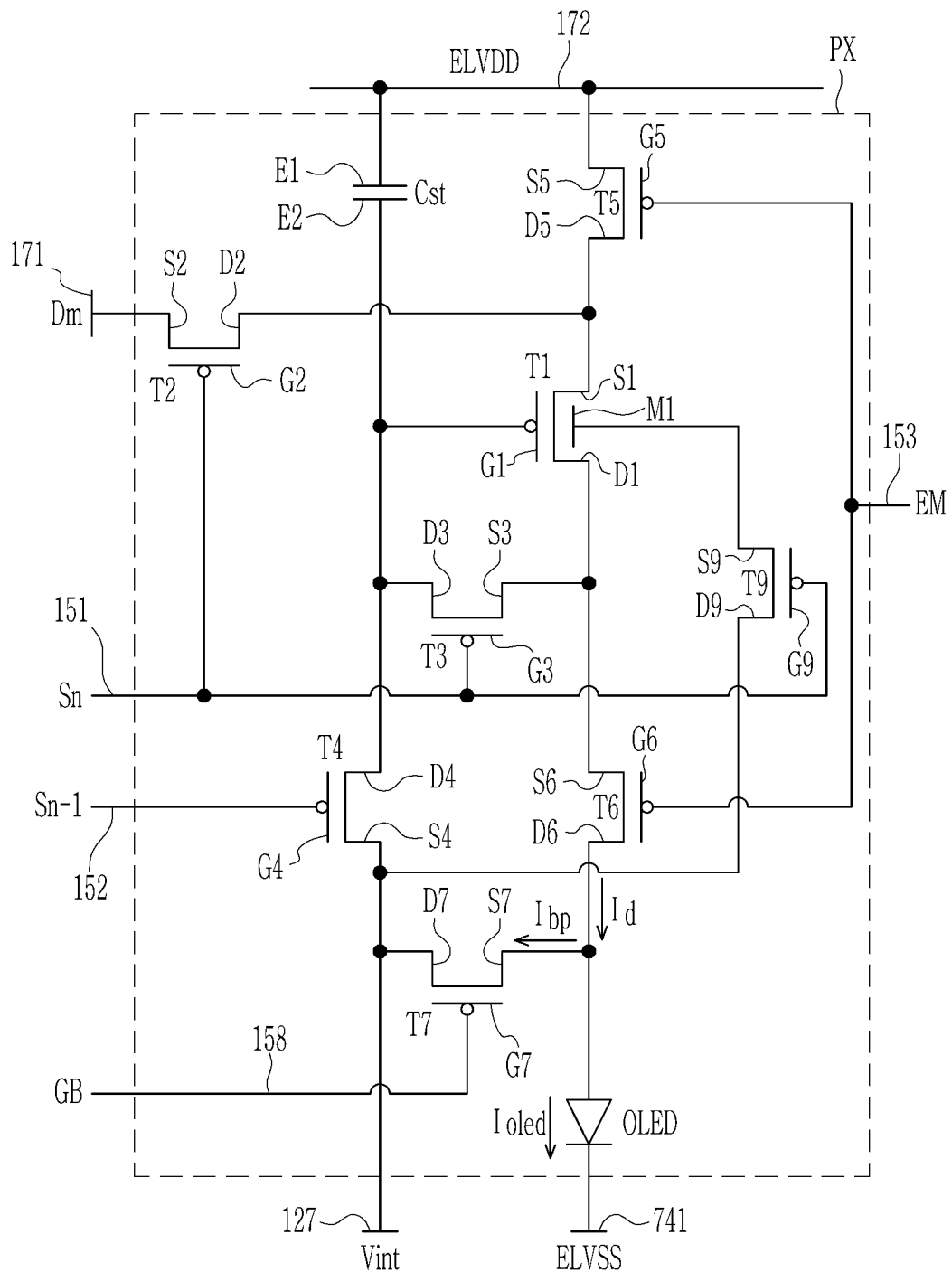
FIG. 11 is an equivalent circuit diagram of a pixel of an organic light emitting diode display according to an exemplary embodiment.

FIG. 11 is an equivalent circuit diagram of a pixel of an organic light emitting diode display according to an exemplary embodiment.

Compared to the embodiment of FIG. 1, in FIG. 11, the eighth transistor T8 and the wires connected to the eighth transistor T8 are omitted. In the exemplary embodiment of FIG. 11, the overlapping layer M1 is connected only with the ninth transistor T9.

In other words, the ninth transistor T9 serves to transmit the initialization voltage Vint to the overlapping layer M1 that overlaps with the driving transistor T1. The gate electrode G9 of the ninth transistor T9 is connected with the scan line 151, the first electrode S9 of the ninth transistor T9 is connected with the overlapping layer M1, and the second electrode D9 of the ninth transistor T9 is connected with the initialization voltage line 127. The ninth transistor T9 is turned on concurrently (e.g., simultaneously) with the second transistor T2 and the third transistor T3 according to the scan signal Sn, and initializes a voltage of the overlapping layer M1.

In the exemplary embodiment of FIG. 11, the eighth transistor T8 is not provided, and thus, the driving voltage ELVDD is not applied to the overlapping layer M1. As a result, the overlapping layer M1 may be continuously applied with the initialization voltage Vint when the ninth transistor T9 is turned on. However, the present disclosure is not limited thereto, and depending on exemplary embodiments, the ninth transistor T9 may also be omitted, and the overlapping layer M1 may be directly connected with the initialization voltage line 127.

Figure 12:
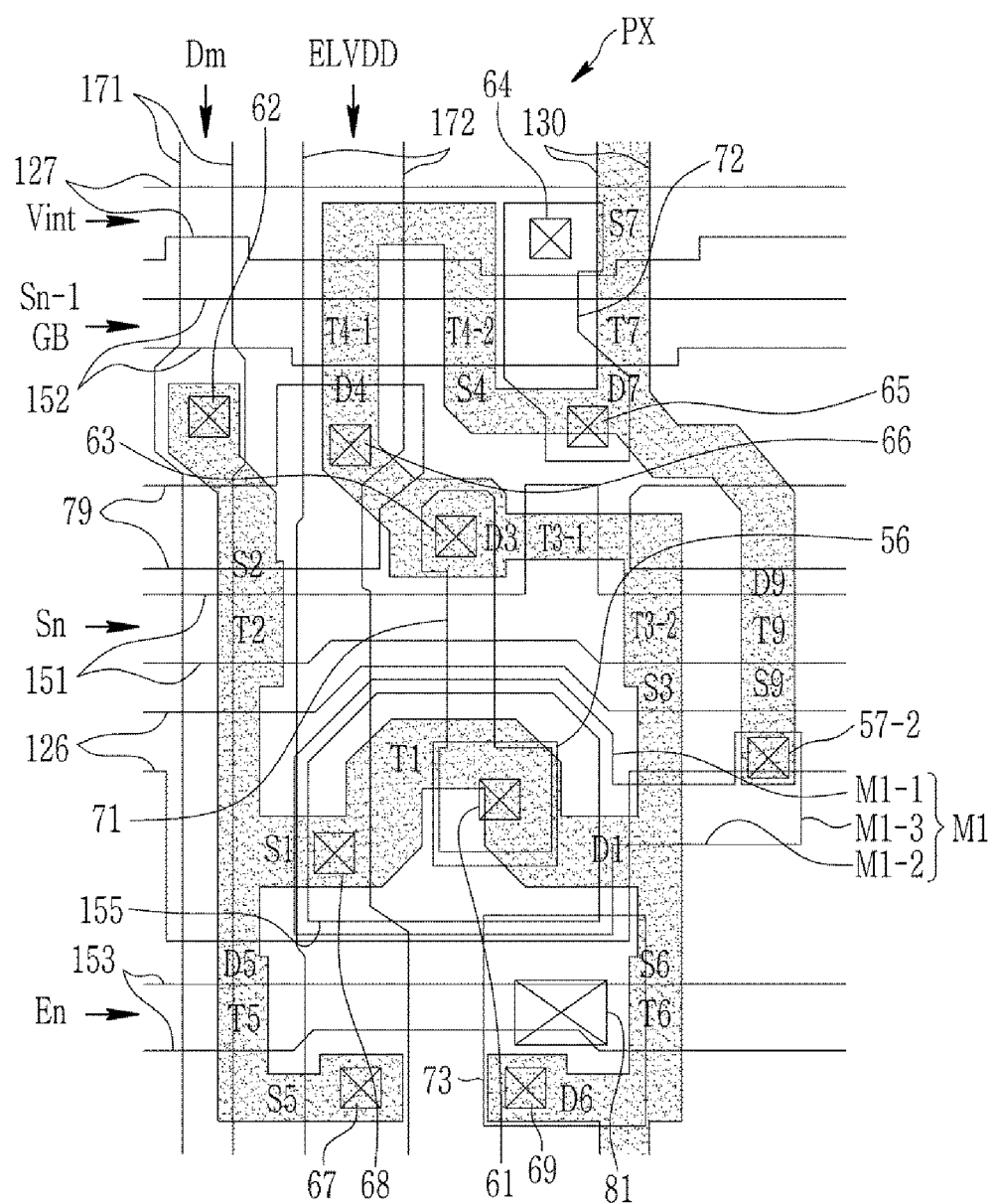
FIG. 12 is a layout view of a pixel area of the organic light emitting diode display according to an exemplary embodiment.

The exemplary embodiment of FIG. 11 may be illustrated in a layout view as shown in FIG. 12.

FIG. 12 is a layout view of a pixel area of the organic light emitting diode display according to an exemplary embodiment.

In the exemplary embodiment of FIG. 12, after passing through a channel of the fifth transistor T5, the semiconductor layer 130 is bent only to the right without extending horizontally. Accordingly, a channel, a first electrode S8, and a second electrode D8 of an eight transistor T8 are not formed in the semiconductor layer 130.

In addition, the contact portion M1-3 of the overlapping layer M1 is bent only upward without expanding downward. Further, the contact portion M1-3 of the overlapping layer M1 is electrically connected with the semiconductor layer 130 where the first electrode S9 of the ninth transistor T9 is located.

In the exemplary embodiments of FIG. 1 to FIG. 8, the eighth transistor T8 and the ninth transistor are T9 both formed, and thus, the driving transistor T1 has a low data range due to the initialization voltage Vint applied to the overlapping layer M1 during the writing section, such that a data voltage is well changed to a capacitor, and during the light emission section, the driving transistor T1 has a high data range due to the driving voltage ELVDD applied to the overlapping layer M1 during the light emission section, such that the driving transistor T1 has a merit of being less sensitive to a change in the voltage Vgs between the gate-source of the driving transistor T1.

However, in the exemplary embodiment of FIG. 11 and FIG. 12, only the ninth transistor T9 is formed, and thus, the driving transistor T1 has a low data range due to the initialization voltage Vint applied to the overlapping layer M1 during the writing section, such that the exemplary embodiment has a merit that a data voltage is well charged to a capacitor.

Compared to the exemplary embodiments of FIG. 1 to FIG. 8, the exemplary embodiments of FIG. 9 to FIG. 12 may have a relative drawback in terms of effectiveness. However, as the display device is implemented with a high resolution, there may be restrictions on a space where the pixels PX may be formed, and thus, it may not be possible to form both the eighth transistor T8 and the ninth transistor T9. In such a case, forming only one of the two transistors (e.g., forming one of the eighth transistor T8 or the ninth transistor T9) and connecting the one transistor with the overlapping layer M1 according to exemplary embodiments may be applied.

In the above example embodiments, a case where the semiconductor formed in the pixel PX is a PMOS transistor using a polycrystalline semiconductor has been described. However, depending on exemplary embodiments, an amorphous semiconductor or an oxide semiconductor may be used, and in these cases, the transistor may have the characteristic of an NMOS transistor. Accordingly, in this case, the magnitude of the voltage applied to the overlapping layer M1 may be opposite. In other words, a high voltage may be applied to the writing section, and a low voltage may be applied to the light emission section.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

| Description of symbols | |
|---|---|
| M1: overlapping layer | M1-1: expansion portion |
| M1-2: extension portion | M1-3: contact portion |
| 110: substrate | 111: barrier layer |
| 112: buffer layer | 130: semiconductor layer |
| 141: first gate insulating layer | 142: second gate insulating layer |
| 160: interlayer insulating layer | 180: passivation layer |
| 56: opening | 57, 57-1, 57-2, 61-69, 81: opening |
| 126: driving voltage horizontal line | 127: initialization voltage line |
| 151: scan line | 152: previous scan line |
| 153: light emission control line | 155: gate electrode |
| 158: bypass control line | 171: data line |
| 172: driving voltage line | 71, 72, 73: data connection member |
| C-1, C-2: addition connecting member | 741: common voltage line |
| 79: capacitor control pattern | |

What is claimed is:

1. An organic light emitting diode display comprising:
a substrate;
an overlapping layer on the substrate;
a pixel on the substrate and the overlapping layer; and
a scan line, a data line, a driving voltage line, and an initialization voltage line that are connected to the pixel,
wherein the pixel comprises:
an organic light emitting diode;
a second transistor connected to the scan line and the data line;
a driving transistor comprising a gate electrode, an input terminal, and an output terminal, and configured to apply a current to the organic light emitting diode from the output terminal; and a voltage application transistor configured to apply a voltage to the overlapping layer,
wherein an output of the second transistor is connected to the input terminal of the driving transistor, and
wherein the overlapping layer is between the driving transistor and the substrate while overlapping with the driving transistor on a plane.

2. The organic light emitting diode display of claim 1, wherein the voltage application transistor comprises a first voltage application transistor, and
The first voltage application transistor is configured to apply a driving voltage to the overlapping layer.

3. The organic light emitting diode display of claim 2, wherein the voltage application transistor further comprises a second voltage application transistor, and
the second voltage application transistor is configured to apply an initialization voltage to the overlapping layer.

4. The organic light emitting diode display of claim 3, wherein the first voltage application transistor is configured to be turned on during a light emission period to apply the driving voltage to the overlapping layer, and
the second voltage application transistor is configured to be turned on during a writing period to apply the initialization voltage to the overlapping layer.

5. The organic light emitting diode display of claim 1, wherein the voltage application transistor is configured to apply an initialization voltage to the overlapping layer.

6. The organic light emitting diode display of claim 1, wherein a first voltage is applied to the overlapping layer during a light emission period, and a second voltage that is different from the first voltage is applied to the overlapping layer during a writing period.

7. The organic light emitting diode display of claim 6, wherein the first voltage has a higher voltage value compared to that of the second voltage.

8. The organic light emitting diode display of claim 7, wherein the first voltage is higher than a threshold voltage of the driving transistor, and the second voltage is lower than the threshold voltage of the driving transistor.

9. The organic light emitting diode display of claim 8, wherein the first voltage is a driving voltage, and the second voltage is an initialization voltage.

10. The organic light emitting diode display of claim 1, wherein the pixel further comprises a third transistor, and
wherein a first electrode of the third transistor is connected with the output terminal of the driving transistor, and a second electrode of the third transistor is connected with the gate electrode of the driving transistor.

11. An organic light emitting diode display comprising:
a substrate;
an overlapping layer on the substrate;
a buffer layer on the overlapping layer;
a semiconductor layer on the buffer layer;
a first gate insulating layer covering the semiconductor layer;
a first gate conductor on the first gate insulating layer;
a second gate insulating layer covering the first gate conductor and the first gate insulating layer;
a second gate conductor on the second gate insulating layer;
an interlayer insulating layer covering the second gate conductor and the second gate insulating layer;
a data conductor on the interlayer insulating layer; and
a passivation layer covering the data conductor and the interlayer insulating layer,
wherein:
a driving transistor comprises a channel in the semiconductor layer, and a gate electrode in the first gate conductor,
the overlapping layer overlaps with the channel of the driving transistor on a plane,
an opening that exposes the overlapping layer penetrates at least a part of the buffer layer, the first gate insulating layer, the second gate insulating layer, and the interlayer insulating layer,
the overlapping layer is configured to be applied with a voltage through the opening, and
the voltage is an initialization voltage that is applied during a writing period, and a driving voltage that is applied during a light emission period.

12. The organic light emitting diode display of claim 11, wherein the semiconductor layer is connected with the overlapping layer through the opening.

13. The organic light emitting diode display of claim 11, wherein an additional connection member in the second gate conductor is a layer connected with the overlapping layer through the opening.

14. The organic light emitting diode display of claim 13, wherein the additional connection member is connected with the semiconductor layer, and
the overlapping layer is configured to receive the voltage that is applied to the semiconductor layer through the additional connection member.

15. The organic light emitting diode display of claim 11, wherein the semiconductor layer comprises a channel of a second transistor, and the second transistor is connected with a scan line and a data line, and
an input terminal of the driving transistor is configured to receive an output of the second transistor.

16. The organic light emitting diode display of claim 15, wherein the semiconductor layer further comprises a channel of a voltage application transistor, and the overlapping layer is configured to be applied with the voltage from the voltage application transistor.

17. The organic light emitting diode display of claim 16, wherein the voltage application transistor comprises a first voltage application transistor configured to apply the driving voltage to the overlapping layer.

18. The organic light emitting diode display of claim 17, wherein the voltage application transistor further comprises a second voltage application transistor configured to apply the initialization voltage to the overlapping layer.

19. The organic light emitting diode display of claim 16, wherein the voltage application transistor is configured to apply the initialization voltage to the overlapping layer.

20. The organic light emitting diode display of claim 11, further comprising a storage capacitor overlapping with the gate electrode of the driving transistor,
wherein the overlapping layer also overlaps with the storage capacitor.

* * * * *